United States Patent
Park et al.

(10) Patent No.: US 12,262,625 B2
(45) Date of Patent: Mar. 25, 2025

(54) FLEXIBLE DISPLAY DEVICE

(71) Applicant: LG Display Co., Ltd., Seoul (KR)

(72) Inventors: Sungjin Park, Seoul (KR); Miyeon Seo, Namyangju-si (KR); GyuHo Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/205,868

(22) Filed: Jun. 5, 2023

(65) Prior Publication Data

US 2023/0403924 A1    Dec. 14, 2023

(30) Foreign Application Priority Data

Jun. 10, 2022   (KR) .................. 10-2022-0070825

(51) Int. Cl.
  *B32B 3/14*        (2006.01)
  *H10K 77/10*       (2023.01)
  *H10K 102/00*      (2023.01)

(52) U.S. Cl.
  CPC ............. *H10K 77/111* (2023.02); *B32B 3/14* (2013.01); *H10K 2102/311* (2023.02); *H10K 2102/351* (2023.02)

(58) Field of Classification Search
  CPC .... B32B 3/14; B32B 3/16; B32B 3/26; B32B 3/30; B32B 2457/20
  See application file for complete search history.

(56) References Cited

U.S. PATENT DOCUMENTS

| | | |
|---|---|---|
| 8,908,365 B2 | 12/2014 | Walters et al. |
| 9,354,476 B2 | 5/2016 | Han et al. |
| 10,617,017 B2 | 4/2020 | Park et al. |
| 10,877,302 B2 | 12/2020 | Shin et al. |
| 11,234,336 B2 | 1/2022 | Kwon et al. |
| 11,616,205 B2 | 3/2023 | Choi |
| 2013/0342094 A1 | 12/2013 | Walters et al. |
| 2015/0043174 A1 | 2/2015 | Han et al. |

(Continued)

FOREIGN PATENT DOCUMENTS

| | | |
|---|---|---|
| CN | 104347000 A | 2/2015 |
| CN | 210181961 U | 3/2020 |

(Continued)

OTHER PUBLICATIONS

Intellectual Property Office of the United Kingdom, Search and Examination Report, United Kingdom Patent Application No. GB2308666.3, Dec. 5, 2023, eight pages.

(Continued)

*Primary Examiner* — Elizabeth E Mulvaney
(74) *Attorney, Agent, or Firm* — Fenwick & West LLP

(57) ABSTRACT

A flexible display device includes a display panel configured to display an image; and a first substrate on the display panel and supporting the display panel, the first substrate including a plurality of first portions extending in a first direction and a second portion between the plurality of first portions that is more elastic than the plurality of first portions, the adhesive unit bonding together the display panel and the first substrate, each of the plurality of first portions includes a flat portion that faces the display panel and a curved portion connected to the flat portion and protruding in a direction away from the flat portion.

20 Claims, 19 Drawing Sheets

(56) References Cited

U.S. PATENT DOCUMENTS

| | | |
|---|---|---|
| 2015/0212547 A1 | 7/2015 | Park et al. |
| 2016/0014883 A1 | 1/2016 | Cho et al. |
| 2016/0064685 A1 | 3/2016 | Kim |
| 2016/0211471 A1 | 7/2016 | Kwon et al. |
| 2017/0141168 A1 | 5/2017 | Choi |
| 2017/0367198 A1 | 12/2017 | Park et al. |
| 2018/0348567 A1 | 12/2018 | Shin et al. |
| 2019/0204872 A1 | 7/2019 | Lee |
| 2019/0326531 A1 | 10/2019 | Choi |
| 2020/0166970 A1 | 5/2020 | Yeom |
| 2021/0027674 A1 | 1/2021 | Niu et al. |
| 2021/0029839 A1 | 1/2021 | Kwon et al. |
| 2021/0165456 A1 | 6/2021 | Gao et al. |
| 2021/0325929 A1* | 10/2021 | Cai .......................... B32B 3/04 |
| 2022/0141968 A1 | 5/2022 | Choi et al. |

FOREIGN PATENT DOCUMENTS

| | | |
|---|---|---|
| CN | 112037664 A | 12/2020 |
| KR | 10-2016-0025152 A | 3/2016 |
| KR | 10-2017-0057913 A | 5/2017 |
| KR | 10-1894030 B1 | 8/2018 |
| KR | 10-2018-0133014 A | 12/2018 |
| KR | 10-2019-0050325 A | 5/2019 |
| TW | 201810213 A | 3/2018 |
| TW | 202105007 A | 2/2021 |

OTHER PUBLICATIONS

Taiwan Intellectual Property Office, Office Action, Taiwanese Patent Application No. 112121360, Mar. 19, 2024, 11 pages.
The Japan Patent Office, Office Action, Japanese Patent Application No. 2023-096188, Feb. 8, 2024, six pages.

* cited by examiner

Pile up effect

FLEXIBLE DISPLAY DEVICE

CROSS-REFERENCE TO RELATED APPLICATION

This application claims the priority of Republic of Korea Patent Application No. 10-2022-0070825 filed on Jun. 10, 2022, in the Korean Intellectual Property Office, which is hereby incorporated by reference in its entirety.

BACKGROUND

Field

The present disclosure relates to a flexible display device, and more particularly, to a flexible display device which has improved durability and appearance quality and is utilized in various forms which require flexibility.

Description of the Related Art

As display devices which are used for a monitor of a computer, a television, a cellular phone, wearable device, video phones, foldable apparatuses, rollable apparatuses, bendable apparatuses, flexible apparatuses, curved apparatuses, variable apparatuses, sliding apparatuses, electronic organizers, electronic books, portable multimedia players (PMPs), personal digital assistants (PDAs), MP3 players, mobile medical devices, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, or the like, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Recently, a flexible display device which is manufactured to be capable of displaying images even though the flexible display device is bent or folded like paper is attracting attention as a next generation display device. The flexible display device utilizes a plastic thin film transistor substrate rather than glass to be classified into an unbreakable display device having a high durability, a bendable display device which is bent without being broken, a rollable display device which is rolled, a foldable display device which is folded, and the like. Such a flexible display device has advantages in terms of space utilization, interior, and designs and has various application fields.

SUMMARY

An object to be achieved by the present disclosure is to provide a flexible display device which efficiently disperses a load concentrated on a display panel to improve the durability.

Another object to be achieved by the present disclosure is to provide a flexible display device in which a boundary in an opening pattern or a folding area and a non-folding area is not visible from a front surface of a display panel.

Objects of the present disclosure are not limited to the above-mentioned objects, and other objects, which are not mentioned above, can be clearly understood by those skilled in the art from the following descriptions.

In one embodiment, flexible display device comprises: a display panel configured to display an image; a first substrate on the display panel and supporting the display panel, the first substrate including a plurality of first portions extending in a first direction and a second portion between the plurality of first portions that is more elastic than the plurality of first portions; and an adhesive unit between the display panel and the first substrate, the adhesive unit bonding together the display panel and the first substrate, wherein each of the plurality of first portions includes a flat portion that faces the display panel and a curved portion connected to the flat portion and protruding in a direction away from the flat portion.

In one embodiment, a flexible display device comprises: an elastic substrate, the elastic substrate including a plurality of cavities extending from a first end of the elastic substrate to a second end of the elastic substrate along a first direction; a plurality of reinforcing portions that are each in a corresponding one of the plurality of cavities such that at least a portion of each reinforcing portion is not covered by the elastic substrate, the plurality of reinforcing portions more rigid than the elastic substrate; and a display panel on the elastic substrate and the plurality of reinforcing portions.

In one embodiment, an elastic substrate comprises: a plurality of cavities extending from a first end of the elastic substrate to a second end of the elastic substrate along a first direction; and a plurality of reinforcing portions that are each in a corresponding one of the plurality of cavities such that at least a portion of each reinforcing portion is not covered by the elastic substrate, the plurality of reinforcing portions more rigid than the elastic substrate; and wherein the elastic substrate is configured to be attached to a display panel.

Other detailed matters of the exemplary embodiments are included in the detailed description and the drawings.

According to the present disclosure, a rigidity of the display panel may be reinforced and a load concentrated on the display panel may be efficiently dispersed.

According to the present disclosure, the flexible driving is possible without disposing an opening pattern and at the same time, a rigidity for supporting the display panel may be ensured.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
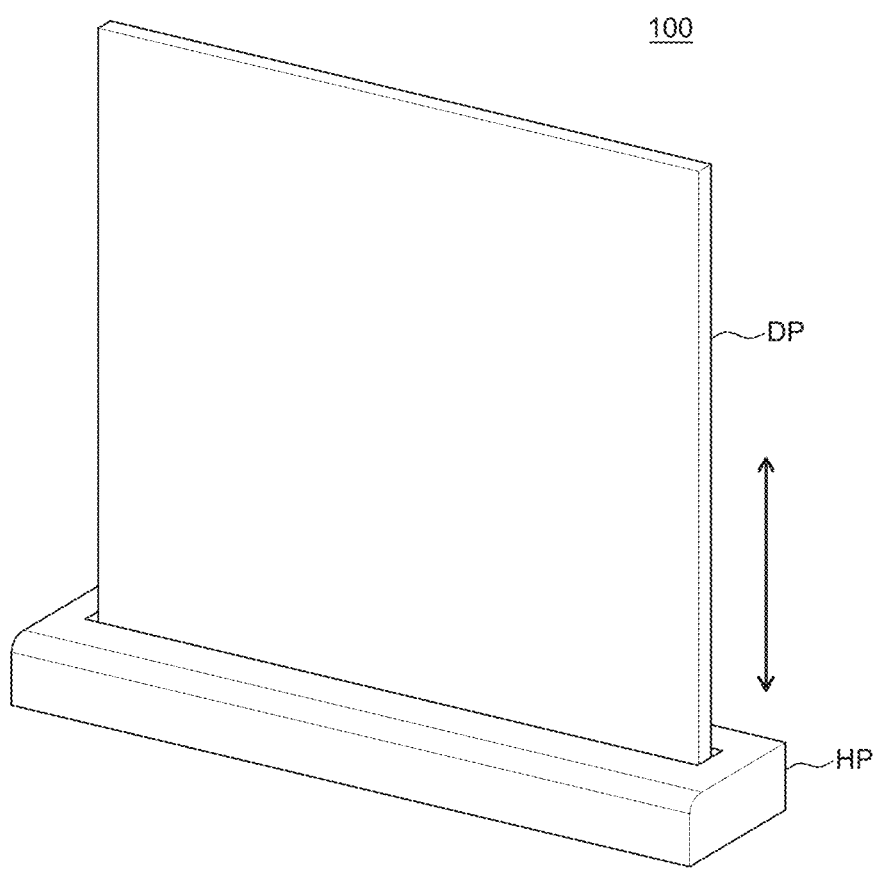
FIGS. 1A and 1B are perspective views of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including', 'having', comprising' used herein are generally intended to allow other components to be added unless the terms are used with the term 'only'. Any references to singular may include plural unless expressly stated otherwise.

Components are interpreted to include an ordinary error range even if not expressly stated.

When the position relation between two parts is described using the terms such as 'on', 'above', 'below', 'next', one or more parts may be positioned between the two parts unless the terms are used with the term 'immediately' or 'directly'.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

<Flexible Display Device-Rollable Display Device>

A rollable display device may be referred to as a flexible display device which is capable of displaying images even though it is in a rolled state. The rollable display device may have a high flexibility as compared with a general flexible display device of the related art. Depending on whether to use a rollable display device, a shape of the rollable display device may freely vary. Specifically, when the rollable display device is not used, the rollable display device is rolled into the rolled state to be stored with a reduced volume. In contrast, when the rollable display device is used, the rolled rollable display device is unrolled to be used.

Figure 1B:
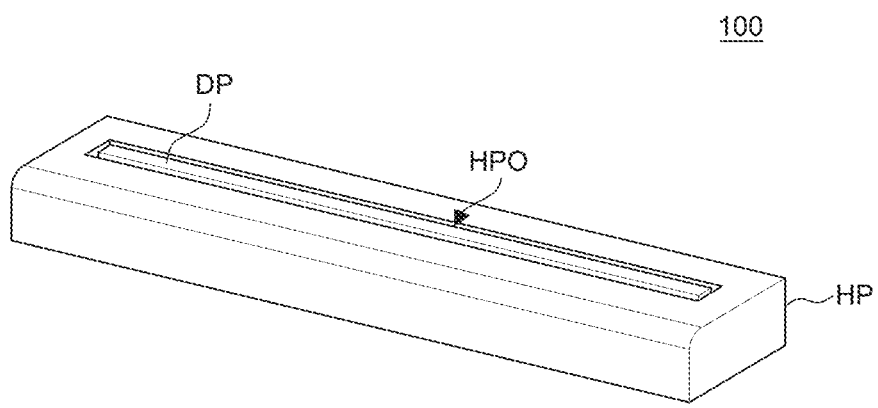

FIGS. 1A and 1B are perspective views of a flexible display device according to an exemplary embodiment of the present disclosure. Referring to FIGS. 1A and 1B, a flexible display device according to an exemplary embodiment of the present disclosure includes a display unit DP and a housing unit HP.

The display unit DP is a configuration for displaying images to a user and for example, in the display unit DP, a display element and a circuit for driving the display element, a wiring line, and a component for driving the display element may be disposed. In this case, since the flexible display device 100 according to the exemplary embodiment of the present disclosure is a rollable display device 100, the display unit DP may be configured to be wound and unwound. For example, the display unit DP may be formed of a display panel 120 and a first substrate 110 each having a flexibility to be wound or unwound. The display unit DP will be described below in more detail with reference to FIG. 4.

The housing unit HP is a case in which the display unit DP is accommodated. The display unit DP may be wound to be accommodated in the housing unit HP in a rolled or wound configuration and the display unit DP may be unwound to be disposed outside of the housing unit HP in an unrolled or unwound configuration.

The housing unit HP has an opening HPO to allow the display unit DP to move inside of the housing unit HP and outside of the housing unit HP. The display unit DP may move up and down in a vertical direction by passing through the opening HPO of the housing unit HP, without being limited thereto. As an example, the display unit DP may move in a direction other than the vertical direction by passing through the opening HPO of the housing unit HP.

In the meantime, the display unit DP of the flexible display device 100 may be switched from a fully unwound state to a partially wound state or a fully wound state, from a fully wound state to a partially wound state or a fully unwound state, or from a partially wound state to a fully wound state or a fully unwound state.

FIG. 1A illustrates a fully unwound state of the display unit DP of the flexible display device 100 and the fully unwound display unit DP of the flexible display device 100 is disposed outside of the housing unit HP. That is, in order for a user to watch images through the flexible display device 100, when the display unit DP is unwound to be disposed at the outside of the housing unit HP as much as possible and cannot be further unwound any more, it may be defined as a fully unwound state.

FIG. 1B illustrates the display unit DP of the flexible display device 100 which is fully wound and in the fully wound state, which refer to a state where the display unit DP of the flexible display device 100 is accommodated in the housing unit HP and cannot be further wound. That is, when the user does not watch the images through the flexible display device 100 or when the display unit DP is not in use, it is advantageous from the viewpoint of an outer appearance that the display unit DP is not disposed at the outside of the housing unit HP. Therefore, when the display unit DP is wound to be accommodated in the housing unit HP in a maximum amount, it is defined as a fully wound state. Further, when the display unit DP is in a fully wound state to be accommodated in the housing unit HP, a volume of the flexible display device 100 is reduced so that the flexible display device 100 may be easily carried. But embodiments are not limited thereto. As an example, even in the fully wound state, a portion of the display unit DP may be still disposed at the outside of the housing unit HP, depending on the design.

In the meantime, in order to switch the display unit DP to a fully unwound state or a fully wound state, a driving unit MP which winds or unwinds the display unit DP is disposed.

<Driving Unit>

Figure 2:
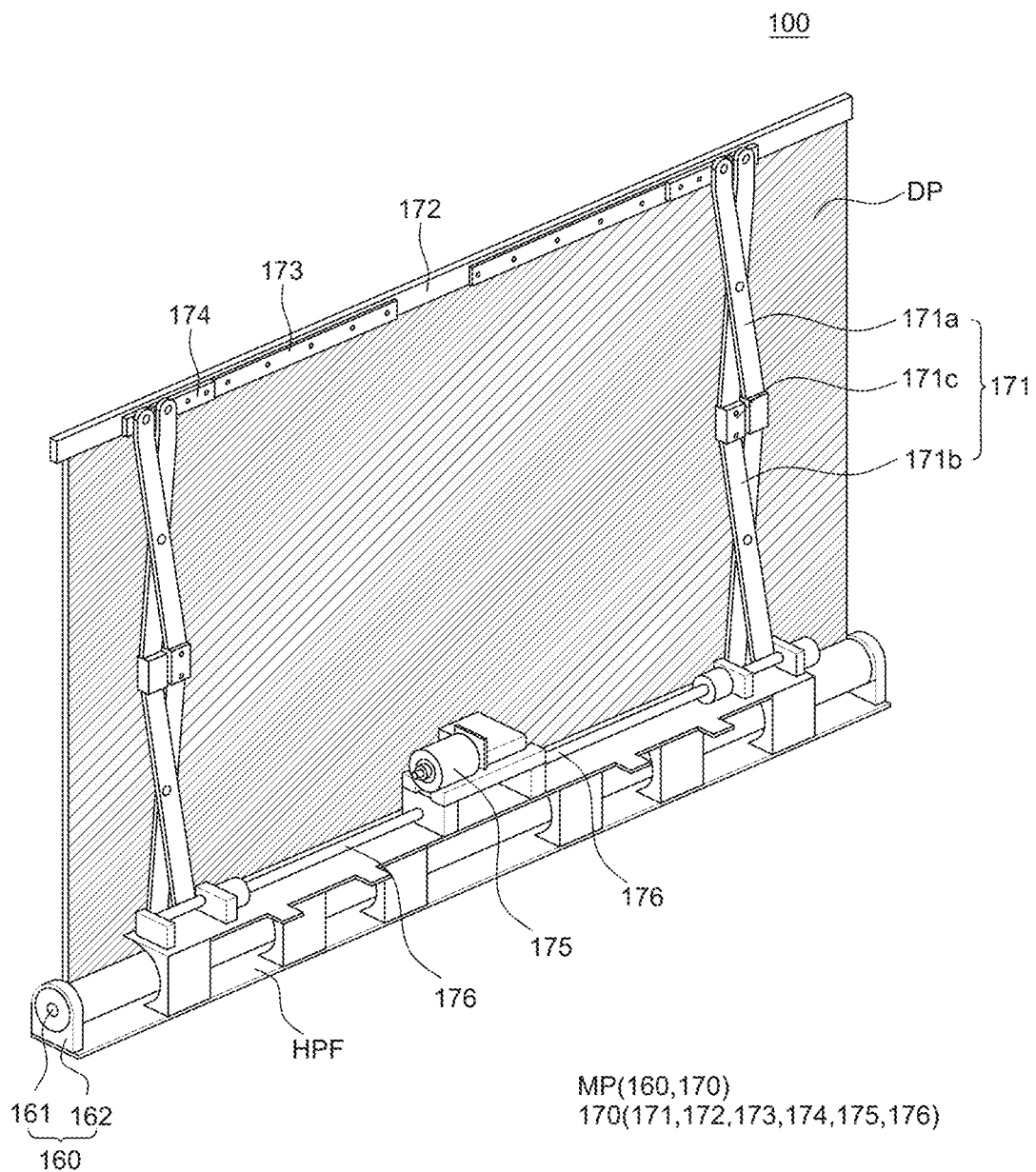
FIG. 2 is a perspective view of a flexible display device according to an exemplary embodiment of the present disclosure.
Figure 3:
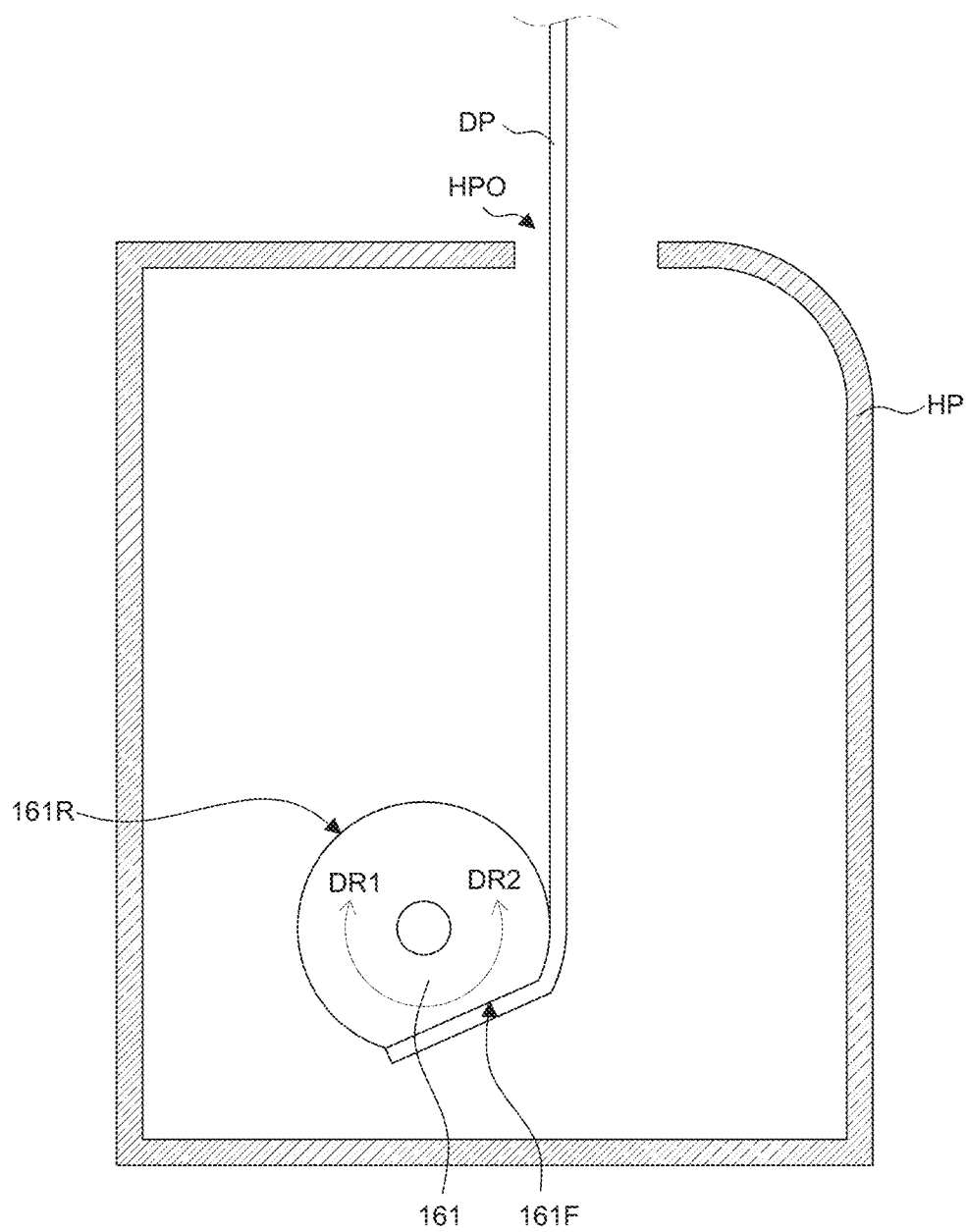
FIG. 3 is a schematic cross-sectional view of a flexible display device according to an exemplary embodiment of the present disclosure.

FIG. 2 is a perspective view of a flexible display device according to an exemplary embodiment of the present disclosure. FIG. 3 is a schematic cross-sectional view of a flexible display device according to an exemplary embodiment of the present disclosure. FIG. 3 is a schematic cross-sectional view for explaining a roller 161 and a display unit DP of a flexible display device 100 according to an exemplary embodiment of the present disclosure. For the convenience of description, in FIG. 3, a housing unit HP, a roller 161, and a display unit DP are illustrated.

First, referring to FIG. 2, the driving unit MP includes a roller unit 160 and a lifting unit 170.

The roller unit 160 rotates in a clockwise direction or a counterclockwise direction to wind or unwind the display unit DP fixed to the roller unit 160 in combination with the lifting unit 170. The roller unit 160 at least includes a roller 161 and a roller support unit 162.

The roller 161 is a member around which the display unit DP is wound. The roller 161 may be, for example, formed to have a cylindrical shape, an oval shape, or a polygonal shape etc. A portion, such as a lower edge, of the display unit DP may be fixed to the roller 161. When the roller 161 rotates, the display unit DP which is fixed to the roller 161 through the lower edge may be wound around the roller 161. In contrast, when the roller 161 rotates in an opposite direction, the display unit DP which is wound around the roller 161 may be unwound from the roller 161.

Referring to FIG. 3, the roller 161 may be formed to have a cylindrical shape in which at least a part of an outer circumferential surface of the roller 161 is flat and the remaining part of the outer circumferential surface is a curved portion. Even though the roller 161 may have entirely a cylindrical shape, a part thereof may be formed of a flat surface. That is, a part of the outer circumferential surface of the roller 161 is formed to be flat and the remaining part of the outer circumferential surface is formed to be a curved surface. For example, the roller 161 may be configured by a curved portion 161R and a flat portion 161F and in the flat portion 161F of the roller 161, the plurality of flexible films and the printed circuit board of the display unit DP may be seated. However, the roller 161 may have a completely cylindrical shape or an arbitrary shape which may wind the display unit DP, but is not limited thereto.

Referring to FIG. 2 again, the roller support unit 162 supports the roller 161. As an example, the roller support unit 162 may support the roller 161 at both sides of the roller 161, without being limited thereto. As an example, the roller support unit 162 may support the roller 161 at any other position of the roller 161. Specifically, the roller support unit 162 is disposed on a bottom surface HPF of the housing unit HP. Upper surfaces of the roller support unit 162 are coupled to the roller 161, such as both ends of the roller 161. By doing this, the roller support unit 162 may support the roller 161 to be spaced apart from the bottom surface HPF of the housing unit HP. In this case, the roller 161 may be rotatably coupled to the roller support unit 162.

The lifting unit 170 moves the display unit DP in a vertical direction in accordance with the driving of the roller unit 160. The lifting unit 170 includes a link unit 171, a head bar 172, a slide rail 173, a slider 174, a motor 175, and a rotary unit 176.

The link unit 170 of the lifting unit 171 includes a plurality of links 171a and 171b and a hinge unit 171c which connects the plurality of links 171a and 171b to each other. Specifically, the plurality of links 171a and 171b includes a first link 171a and a second link 171b and the first link 171a and the second link 171b cross each other in the form of scissors to be rotatably fastened by means of the hinge unit 171c. When the link unit 171 moves in the vertical direction, the plurality of links 171a and 171b may rotate to be far away from each other or close to each other.

The head bar 172 of the lifting unit 170 is connected to an uppermost end of the display unit DP. The head bar 172 is coupled to the link unit 171 to move the display unit DP in the vertical direction in accordance with the rotation of the plurality of links 171a and 171b of the link unit 171. That is, the display unit DP may move in a vertical direction by the head bar 172 and the link unit 171.

The head bar 172 covers a part of a surface which is adjacent to an uppermost edge of the display unit DP so as not to hide an image displayed on the front surface of the display unit DP. The display unit DP and the head bar 172 may be fixed by a screw, but are not limited thereto. As an example, the display unit DP and the head bar 172 may be fixed by an adhesive or by a magnetic force, etc.

The slide rail 173 of the lifting unit 170 provides a movement path of the plurality of links 171a and 171b. Parts of the plurality of links 171a and 171b are rotatably fastened with the slide rail 173 so that the motion may be guided along a trajectory of the slide rail 173. Parts of the plurality of links 171a and 171b are fastened with the slider 174 which is movably provided along the slide rail 173 to move along the trajectory of the slide rail 173.

The motor 175 is connected to a power generating unit, such as a separate external power source or a built-in battery, to be supplied with the power. The motor 175 generates a torque to provide a driving force to the rotary unit 176. The above driving mechanism is just an example, as long as the display unit DP can be driven to be wound or unwound, the link unit 170 may be variously modified.

The rotary unit 176 is connected to the motor 175 to be configured to convert a rotational motion from the motor 175 into a linear reciprocating motion. That is, the rotational motion of the motor 175 may be converted into the linear reciprocating motion of a structure fixed to the rotary unit 176. For example, the rotary unit 176 may be implemented by a ball screw including a shaft and a nut which is fastened with the shaft, but is not limited thereto.

The motor 175 and the rotary unit 176 interwork with the link unit 171 to lift and lower the display unit DP. The link unit 171 is formed with a link structure to receive the driving force from the motor 175 and the rotary unit 176 to be repeatedly folded or unfolded.

Specifically, when the display unit DP is wound, the motor 175 is driven so that the structure of the rotary unit 176 may perform the linear motion. That is, a part of the rotary unit 176 to which one end of the second link 171b is coupled may perform the linear motion. Therefore, one end of the second link 171b moves to the motor 175 and the plurality of links 171a and 171b is folded so that the height of the link unit 171 may be lowered. Further, while the plurality of links 171a and 171b is folded, the head bar 172 coupled to the first link 171a is also lowered and one end of the display unit DP coupled to the head bar 172 is also lowered.

When the display unit DP is unwound, the motor 175 is driven so that the structure of the rotary unit 176 may perform linear motion. That is, a part of the rotary unit 176 to which one end of the second link 171b is coupled may perform the linear motion. Therefore, one end of the second link 171b may move to be away from the motor 175 and the plurality of links 171a and 171b is unfolded so that the height of the link unit 171 may be increased. Further, while the plurality of links 171a and 171b are unfolded, the head bar 172 coupled to the first link 171a is also lifted and the display unit DP coupled to the head bar 172 is also lifted.

Accordingly, when the display unit DP is fully wound around the roller 161, the link unit 171 of the lifting unit 170 maintains a folded state. That is, when the display unit DP is fully wound around the roller 161, the lifting unit 170 may have a smallest height. In contrast, when the display unit DP is fully unwound, the link unit 171 of the lifting unit 170 maintains an unfolded state. That is, when the display unit DP is fully unwound, the lifting unit 170 may have a largest height.

In the meantime, when the display unit DP is wound, the roller 161 may rotate and the display unit DP may be wound around the roller 161. Referring to FIG. 3, a lower edge of the display unit DP is coupled to the roller 161. When the roller 161 rotates in a first direction DR1, that is, a clockwise direction, the display unit DP may be wound while a rear surface of the display unit DP is in close contact with a surface of the roller 161.

When the display unit DP is unwound, the roller 161 may rotate and the display unit DP may be unwound from the roller 161. For example, referring to FIG. 3, when the roller 161 rotates in a second direction DR2, that is, in a counter-clockwise direction in FIG. 3, the display unit DP which is wound around the roller 161 is unwound from the roller 161 to be disposed at the outside of the housing unit HP.

In some exemplary embodiments, a driving unit MP having another structure other than the above-described driving unit MP may be applied to the flexible display device 100. That is, as long as the display unit DP is wound and unwound, the above-described configuration of the roller unit 160 and the lifting unit 170 may be modified, some configurations may be omitted, or another configuration may be added.

<Display Unit>

Figure 4:
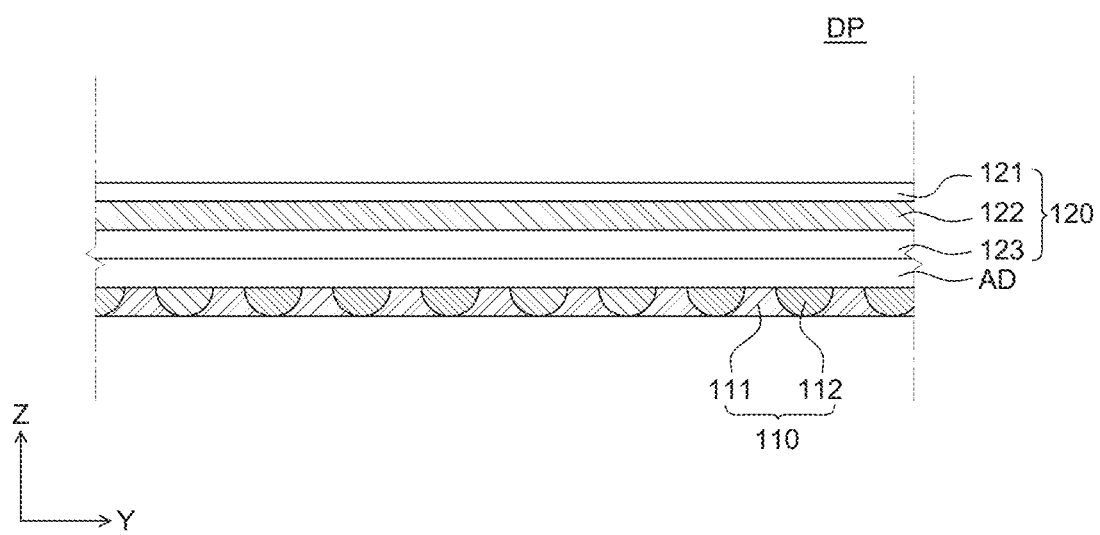
FIG. 4 is a schematic cross-sectional view of a display unit of a flexible display device according to an exemplary embodiment of the present disclosure.

FIG. 4 is a cross-sectional view of a display unit of a flexible display device according to an exemplary embodiment of the present disclosure.

Referring to FIG. 4, the display unit DP includes a first substrate 110, a display panel 120, and an adhesive unit AD. However, it is not limited thereto and the display unit DP may be defined to further include a plurality of flexible films and a printed circuit board.

The display panel 120 is a panel configured to displays images to a user. The display panel 120 may include a display element which displays images, a driving element which drives the display element, wiring lines which transmit various signals to the display element and the driving element, and the like.

The display element may be defined in different manners depending on the type of the display panel 120. For example, when the display panel 120 is an organic light emitting display panel, the display element may be an organic light emitting diode or Micro-LED which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the flexible display device 100 according to the exemplary embodiment of the present disclosure is a rollable display device 100, the display panel 120 may be implemented as a flexible display panel 120 to be wound around or unwound from the roller 161.

The display panel 120 includes a display area and a non-display area in the vicinity of the display area or surrounded in the display area.

The display area is an area where images are displayed in the display panel 120. In the display area, a plurality of sub pixels which configure the plurality of pixels and a driving circuit for driving the plurality of sub pixels may be disposed to display an image. The plurality of sub pixels are minimum units which configure the display area and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a driving circuit for driving the plurality of sub pixels may include a driving element, a wiring line, and the like. For example, the driving circuit may be configured by a thin film transistor, a storage capacitor, a gate line, a data line, and the like, but is not limited thereto.

The non-display area is an area where no image is displayed. In the non-display area, various wiring lines, circuits, and the like for driving an organic light emitting diode in the display area are disposed. For example, in the non-display area, a link line which transmits signals to the plurality of sub pixels and driving circuits of the display area, pad area, a driving IC such as a gate driver IC or a data driver IC, or the like may be disposed, but the non-display area is not limited thereto.

In the meantime, the non-display area includes a pad area and a gate driving area.

The pad area is an area in which a plurality of pads are disposed. The plurality of pads is electrodes which electrically connect the plurality of flexible films or other external device and the display panel 120 to each other so that the plurality of flexible films and the display panel 120 may be electrically connected by the plurality of pads. The pad area may be a lowermost area of the non-display area in a vertical direction. However, the pad area may be formed in the other part of the non-display area depending on the arrangement of the plurality of flexible films, but is not limited thereto.

The gate driving area of the non-display area is an area where a gate driver is disposed. The gate driving area may be non-display areas at the left and right sides of the display area, without being limited thereto. The gate driver area may be disposed outside the display area. A logic unit, a gate power supply unit, a clock unit, and the like constituting the gate driver, may be disposed in the gate driving area, the gate driver outputs a gate voltage and an emission control voltage under the control of the timing controller to select a sub pixel in which a data voltage is charged through a wiring line such as a gate line or an emission control signal line and adjust an emission timing. Hereinafter, it is assumed that the gate driver is formed directly on the flexible substrate 121 by a gate-driver in panel (GIP) manner, but is not limited thereto. In this case, the gate driving area where the gate driver is disposed may also be referred to as a GIP area. Alternatively, the gate driver may be connected to a bonding pad of the display panel by a tape automated bonding (TAB) method or a chip-on-glass (COG) method. Alternatively, the gate driver may be integrated and distributed in the display area. Alternatively, the gate driver may be implemented in a chip-on-film (COF) method to be mounted on a film connected to the display panel. In these cases, the gate driving area may be omitted in the non-display area.

Referring to FIG. 4, the first substrate 110 is disposed on a rear surface of the display panel 120 to support the display panel 120. The first substrate 110 is disposed on the rear surface of the display panel 120 so that it is referred to as a back cover or a bottom plate. The first substrate 110 may protect other configurations of the display unit DP from the outside. A size of the first substrate 110 may be equal to or larger than a size of the display panel 120, but is not limited thereto.

At least a part of the first substrate 110 may have a flexibility to be wound or unwound together with the display panel 120. For example, the first substrate 110 may be formed of a composite material in which a rigid material such as metal (e.g., steel use stainless (SUS), Cu, Al, etc.), inorganic non-metal materials (e.g., glass, ceramic, etc.) and organic materials having rigidity, and an elastic material such as elastomer are mixed. However, as long as the material of the first substrate 110 satisfies physical conditions, such as a thermal strain, a radius of curvature, and a rigidity, the material may be diversely changed depending on the design, and is not limited thereto. The configuration of the first substrate will be described below in more detail with reference to FIGS. 5A to 5C.

The first substrate 110 may be fastened with the head bar 172 and the roller 161.

An uppermost area of the first substrate 110 is an area fastened with the head bar 172. A first fastening hole may be formed in the uppermost area of the first substrate 110 to be fastened with the head bar 172. For example, fasteners (e.g., screws) which pass through the head bar 172 and the first fastening holes are disposed so that the head bar 172 may be fastened with the uppermost area of the first substrate 110. But embodiments are not limited thereto. As an example, the display unit DP and the head bar 172 may also be fixed by an adhesive or by a magnetic force. In these cases, the first fastening hole may be omitted, and the area of the first substrate 110 fastened with the head bar 172 may be adjusted. As the uppermost area of the first substrate 110 is fastened with the head bar 172, when the link unit 171 which is fastened with the head bar 172 is lifted or lowered, the first substrate 110 may be also lifted and lowered together with the display panel 120 which is attached to the first substrate 110. Even though it is described that the first substrate 110 is fastened with the head bar 172 using the first fastening holes, it is not limited thereto so that the first substrate 110 and the head bar 172 may be fastened without using a separate fastening hole.

One end of the display panel 120 is disposed in the lowermost area of the first substrate 110. For example, a pad area which is a non-display area at one end of the display panel 120 may be disposed in the lowermost area of the first substrate 110.

In the meantime, when the lowermost area of the first substrate 110 is wound around the roller 161, an outer circumferential surface of the roller 161 which overlaps the lowermost area of the first substrate 110 may be a flat portion 161F. Therefore, the lowermost area of the first substrate 110 may always maintain the flat state regardless of the wound or unwound state to the roller 161 and the pad area at one end of the display panel 120 and the printed circuit board which are disposed in the lowermost area of the first substrate 110 may also maintain the flat state. As another example, when the lowermost area of the first substrate 110 is wound around the roller 161, an outer circumferential surface of the roller 161 which overlaps at least the pad area of the display panel 120 may be the flat portion 161F. But embodiments are not limited thereto.

Referring to FIG. 4, the display panel 120 includes a flexible substrate 121, a pixel unit 122, and an encapsulation layer 123.

The flexible substrate 121 is a base member which supports various components of the display panel 120 and may be configured by an insulating material. The flexible substrate 121 may be formed of a material having a flexibility to allow the display panel 120 to be wound or unwound. For example, the flexible substrate 121 may be formed of a plastic material such as polyimide (PI) and polyethylene terephthalate (PET), etc., or a thin glass, without being limited thereto.

A buffer layer is disposed on a top surface of the flexible substrate 121. The buffer layer may suppress moisture and/or oxygen which penetrates from the outside of the flexible substrate 121 from being spread. The buffer layer may be formed of an inorganic material, and for example, may be configured by a single layer or a double layer of silicon oxide (SiOx) and silicon nitride (SiNx) or even a multiple layer of other materials, but is not limited thereto.

The pixel unit 122 is disposed on top surfaces (e.g., uppermost surfaces) of the flexible substrate 121 and the buffer layer. The pixel unit 122 includes a plurality of organic light emitting diodes and a circuit for driving the organic light emitting diodes. The pixel unit 122 may be disposed so as to correspond to the display area AA.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the flexible substrate 121 on which the organic light emitting diode is formed to allow an image to be displayed. In the case of the top emission type, a reflective layer may be formed below the anode to allow the light emitted from the organic light emitting diode to travel to the upper portion of the flexible substrate 121, that is, toward the cathode.

According to the bottom emission type, light emitted from the organic light emitting diode is emitted to a lower portion of the flexible substrate 121 on which the organic light emitting diode is formed. In the case of the bottom emission type, the anode may be formed only of a transparent conductive material and the cathode may be formed of the conductive material such as the metal material having a high reflectance to allow the light emitted from the organic light emitting diode to travel to the lower portion of the flexible substrate 121.

Hereinafter, for the convenience of description, the description will be made by assuming that the flexible display device 100 according to an exemplary embodiment of the present disclosure is a bottom emission type display device, but it is not limited thereto. As an example, in the case of the top emission type, the arrangement of the display panel 120 may be inverted as compared with that shown in FIG. 4, without being limited thereto.

The encapsulation layer 123 is disposed to cover the pixel unit 122. The encapsulation layer 123 seals the organic light emitting diode of the pixel unit 122. The encapsulation layer 123 may protect the organic light emitting diode of the pixel unit 122 from moisture, oxygen, and impacts of the outside. The encapsulation layer 123 may be formed by a single layer of an inorganic layer or an organic layer, or formed by alternately laminating a plurality of inorganic layers and a plurality of organic layers, without being limited thereto. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto.

Even though not illustrated in the drawing, an encapsulation substrate may be disposed on the encapsulation layer 123. Specifically, the encapsulation substrate is disposed between the encapsulation layer 123 and the first substrate 110. The encapsulation substrate may protect the organic light emitting diode of the pixel unit 122 together with the encapsulation layer 123. The encapsulation substrate may protect the organic light emitting diode of the pixel unit 122 from moisture, oxygen, and impacts of the outside. For example, the encapsulation substrate may be formed of a material having a high modulus of approximately 200 to 900 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel, etc., without being limited thereto. Therefore, as the encapsulation substrate is formed of a metal material, the encapsulation substrate may be implemented as an ultra-thin film and provide a strong resistance against external impacts and scratches.

An encapsulation adhesive layer may be further disposed between the encapsulation layer 123 and the encapsulation substrate. The encapsulation adhesive layer may bond the encapsulation layer 123 and the encapsulation substrate. The encapsulation adhesive layer is formed of a material having adhesiveness and may be a thermosetting or natural curable type adhesive. For example, the encapsulation adhesive layer may be formed of an optical clear adhesive (OCA), a pressure sensitive adhesive (PSA), or the like, but is not limited thereto.

In the meantime, the encapsulation adhesive layer may be disposed so as to enclose the encapsulation layer 123 and the pixel unit 122. That is, the pixel unit 122 may be sealed by the buffer layer and the encapsulation layer 123 and the encapsulation layer 123 and the pixel unit 122 may be sealed by the buffer layer and the encapsulation adhesive layer. The encapsulation adhesive layer may protect the organic light emitting diode of the pixel unit 122 from moisture, oxygen, and impacts of the outside together with the encapsulation layer 123 and the encapsulation substrate. At this time, the encapsulation adhesive layer may further include a moisture absorbent. The moisture absorbent may be particles having hygroscopicity and absorb moisture and oxygen from the outside to reduce or minimize permeation of the moisture and oxygen into the pixel unit 122.

Referring to FIG. 4, an adhesive unit AD which bonds the display panel 120 and the first substrate 110 is disposed. The adhesive unit AD is disposed between the display panel 120 and the first substrate 110 to bond together the display panel 120 and the first substrate 110. The adhesive unit AD may bond the display panel 120 and the first substrate 110 by bonding together the encapsulation substrate and the first substrate 110. The adhesive unit AD may be disposed between the encapsulation substrate and the first substrate 110 and may bond the encapsulation substrate and the first substrate 110.

Even though not illustrated in the drawing, a polarizer may be disposed on a front surface of the display panel 120. The polarizer selectively transmits light to reduce the reflection of external light which is incident onto the display panel 120. Specifically, the display panel 120 includes various metal materials applied to the semiconductor element, the wiring line, and the organic light emitting diode. By doing this, the external light incident onto the display panel 120 may be reflected from the metal material so that the visibility of the flexible display device 100 may be reduced due to the reflection of the external light. Therefore, when the polarizer is disposed, the polarizer suppresses the reflection of the external light to increase the outdoor visibility of the flexible display device 100. However, the polarizer may be omitted depending on an implementation embodiment of the flexible display device 100.

A plurality of flexible films are disposed at one end of the display panel 120. The plurality of flexible films are films in which various components are disposed on a base film having a malleability and supplies a signal to the plurality of sub pixels which configures the plurality of pixels of the display area and the driving circuits and may be electrically connected to the display panel 120. One ends of the plurality of flexible films may be connected to (e.g., disposed) in the non-display area of the display panel 120 to supply a signal such as a power voltage or a data voltage to the plurality of sub pixels and the driving circuits of the display area. In the meantime, the number of flexible films may vary depending on the design, but is not limited thereto.

A driving integrated circuit (IC) such as a gate driver IC or a data driver IC may be disposed on a base film of the plurality of flexible films. The driving IC is a component which processes data for displaying images and a driving signal for processing the data. The driving IC may be disposed by a chip on glass (COG), a chip on film (COF), or a tape carrier package (TCP) technique depending on a mounting method.

In the meantime, the plurality of flexible films are components in which a base film, data for displaying images on the base film and various driving ICs which control the data are disposed to display images. The plurality of flexible films are electrically connected to the pad area at one end of the display panel 120 to be bent toward a rear surface of the first substrate 110. First ends of the plurality of flexible films are connected to one end of the display panel 120 on one surface of the first substrate 110 and second ends of the plurality of flexible films may be disposed at an opposite surface of the one surface of the first substrate 110, but is not limited thereto.

The printed circuit board is disposed on the rear surface of the first substrate 110 to be connected to the plurality of flexible films. That is, the printed circuit board is disposed on the rear surface of the first substrate 110 to be electrically connected to the plurality of flexible films. The printed circuit board is a component which supplies signals to the driving IC of the plurality of flexible films. Various components may be disposed in the printed circuit board to supply various signals such as a driving signal or a data signal to the driving IC. The number of printed circuit board may vary depending on the design, and is not limited thereto.

In the meantime, an additional printed circuit board which is connected to the printed circuit board may be further disposed. For example, the printed circuit board may be referred to as a source printed circuit board S-PCB on which the data driver is mounted and the additional printed circuit board connected to the printed circuit board may be referred to as a control printed circuit board C-PCB on which a timing controller or the like is mounted. The additional printed circuit board may be disposed in the roller 161 or disposed in the housing unit HP at the outside of the roller 161, or disposed to be in direct contact with the printed circuit board, without being limited thereto.

Hereinafter, the first substrate 110 will be described in more detail with reference to FIGS. 5A to 5C together.

<First Substrate>

Figure 5A:
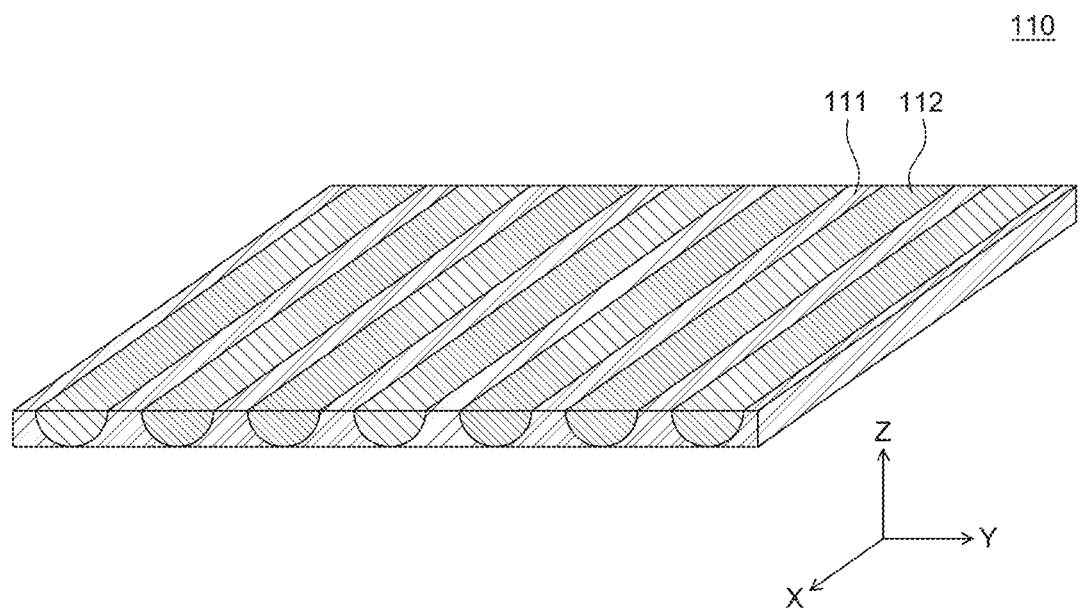
FIG. 5A is a perspective view of a first substrate of a flexible display device according to an exemplary embodiment of the present disclosure.

FIG. 5A is a perspective view of a first substrate of a flexible display device according to an exemplary embodiment of the present disclosure. FIG. 5B is a cross-sectional view of a first substrate of a flexible display device according to an exemplary embodiment of the present disclosure. FIG. 5C is a cross-sectional view for explaining a wound state of a first substrate of a flexible display device according to an exemplary embodiment of the present disclosure.

Figure 5B:
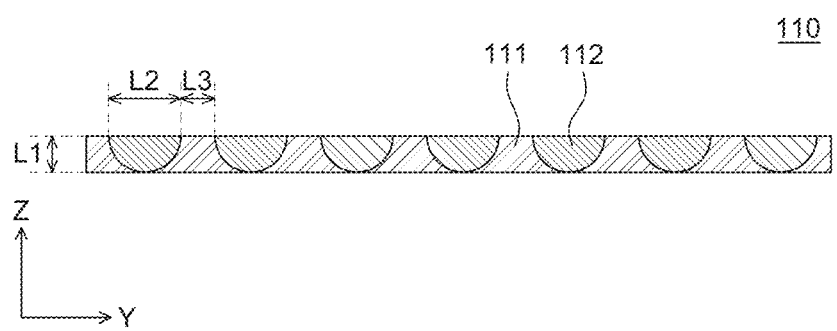
FIG. 5B is a cross-sectional view of a first substrate of a flexible display device according to an exemplary embodiment of the present disclosure.
Figure 5C:
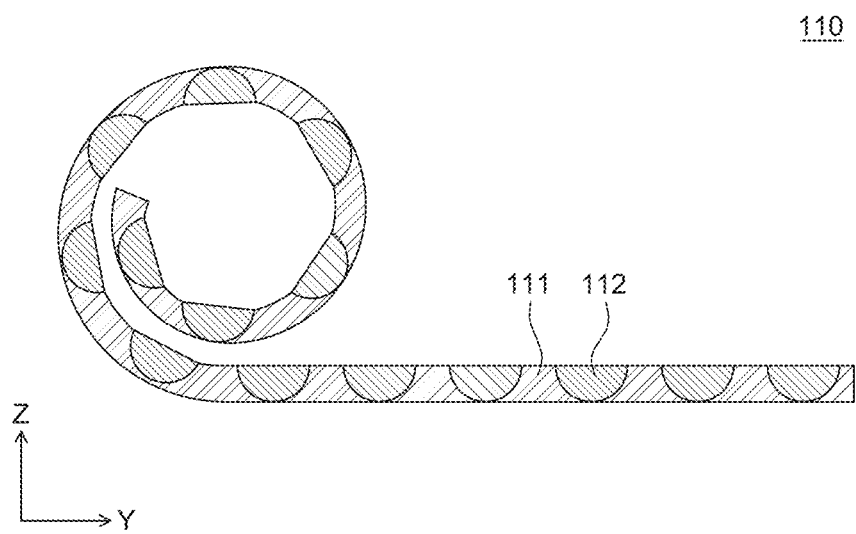
FIG. 5C is a cross-sectional view for explaining a wound state of a first substrate of a flexible display device according to an exemplary embodiment of the present disclosure.

Referring to FIGS. 5A to 5C, the first substrate 110 includes a plurality of rigid portions 112 (e.g., first portions) and an elastic portion 111 (e.g., a second portion).

The first substrate 110 may be a composite material which includes a plurality of rigid portions 112 formed of a rigid material and an elastic portion 111 (e.g., an elastic substrate) formed of an elastic material. Therefore, the first substrate 110 is bent together with the display panel 120 while flexible driving of the flexible display device 100 to support the display panel 120 and reinforce the rigidity of the display panel 120.

The elastic portion 111 may correspond to a base material (matrix) among the materials of the first substrate 110 formed of a composite material. The elastic portion 111 may be disposed so as to be filled between the plurality of rigid portions and the elastic portion 111 may be disposed so as to enclose the plurality of rigid portions 112. That is, a plurality of rigid portions 112 may be inserted into a plurality of cavities formed in from a first end to a second end of the elastic portion 111 along the X-direction. Specifically, the elastic portion 111 may be disposed so as to enclose (e.g., overlap) side surfaces of the plurality of rigid portions 112 without covering a portion of the rigid portions 112. For example, the elastic portion 111 may be disposed to expose a part of a top surface and a bottom surface of the rigid portion 112 or disposed to have a shape of covering a part of the top surface and the bottom surface of the rigid portion, or disposed to cover all the surfaces of the rigid portion 112. Therefore, the rigid portion 112 is inserted into the elastic portion 111 to be enclosed by the elastic portion 111. Accordingly, the elastic portion 111 may be configured to fix the positions of the plurality of rigid portions 112.

The elastic portion 111 may have a flexibility. Accordingly, when the flexible display device 100 is wound or unwound, the elastic portion 111 may be configured to support the display panel 120 while the first substrate 110 is wound around or unwound from the roller 161 together with the display panel 120.

The elastic portion 111 may be formed of an elastic material. For example, the elastic portion 111 may be formed of an elastomer-based material such as silicon and rubber. Therefore, an elastic modulus of the elastic portion 111 may be 10 MPa to 1400 Mpa. However, the material of the elastic portion 111 may vary depending on a characteristic demanded for the product, but is not limited thereto.

The plurality of rigid portions 112 may be formed of a rigid material. The rigid portions 112 are stiffer than the elastic portion 111 and may be referred to as reinforcing portions. The plurality of rigid portions 112 may correspond to a core-shaped reinforcement, among materials of the first substrate 110 formed of a composite material. The rigid portion 112 may have a high elastic modulus that is greater than the elastic modulus of the elastic portion 111 and a low coefficient of thermal expansion CTE. As an example, the rigid portion 112 may have a higher elastic modulus and/or a lower coefficient of thermal expansion CTE compared with those of the elastic portion 111. Therefore, the rigid portion 112 may increase the elastic restoring force of the first substrate 110 to improve the durability of the first substrate 110. Further, the rigid portion 112 may improve the resistance of the first substrate 110 against the physical distortion and the thermal distortion.

The rigid portion 112 may be formed of a high elastic and high rigid material, which is any one of polymer such as vero-black, a composite material, metal, an alloy, an oxide ceramic, a nitride ceramic, and a carbide ceramic, etc. Therefore, an elastic modulus of the rigid portion 112 may be at least 1 GPa, such as 1 Gpa to 1000 Gpa. However, the material of the rigid portion 112 is not limited thereto.

In the meantime, the rollable display device, such as a flexible display device 100 according to the exemplary embodiment of the present disclosure, may be applied to a large-size flexible display device which is heavier and larger than a different type of flexible display device, like the foldable display device. In this case, a rigidity of the rigid portion 112 may be more important than the flexibility. Therefore, the rigid portion 112 which is applied to the large-size flexible display device may be formed of a material having a high rigidity, such as an oxide ceramic, a nitride ceramic, and a carbide ceramic, among materials presented as the material of the rigid portion 112 described above. At this time, an elastic modulus of the rigid portion 112 may be at least 60 GPa, such as 60 Gpa to 1000 Gpa.

The plurality of rigid portions 112 may extend in a first direction, that is, in an X-axis direction, which is different from the winding direction of the display unit DP. As an example, the first direction, that is, the X-axis direction, may be perpendicular to winding direction of the display unit DP. That is, each of the plurality of rigid portions 112 may have a shape elongated in the first direction. Each of the plurality of rigid portions 112 may include a flat portion and a curved portion. Specifically, each of the plurality of rigid portions 112 may include a substantially flat portion located at a first end of the rigid portion 112 in a direction in which the display panel 120 is disposed and a curved portion at a second end of the rigid portion that is opposite the first end. The curved portion may extend from the flat portion and protrude in an opposite direction of the flat portion. That is, the cross-section of the plurality of rigid portions 112 may have a half-cylindrical shape extending in the first direction (i.e., in the sectional view on the plane constituted by the Y-axis and Z-axis). However, the shapes of the plurality of rigid portions 112 may be a columnar shape including a curved portion and a flat portion, rather than the half-cylindrical column, but is not limited thereto.

In the meantime, referring to FIGS. 5A to 5C, the flat portion of the rigid portion 112 on the first substrate 110 may be disposed on the same plane as the top surface of the elastic portion 111. Specifically, the flat portion of the rigid portion 112 is not covered by the elastic portion 111, but may be disposed on the same plane as the top surface of the elastic portion 111, so as to be exposed toward the display panel 120. Therefore, a pile-up phenomenon in which the elastic portion 111 which is an elastic material adjacent to the rigid portion 112 is pushed or thickened due to the stress transmitted from the display panel 120 in the upper portion of the rigid portion 112 occurs. Therefore, the first substrate 110 may be configured to mitigate or reduce a problem in that the first substrate 110 is deformed or the stress is concentrated.

Further, the lowermost end of the rigid portion 112 in a Z-axis direction may be disposed on the same plane as the bottom surface of the first substrate 110. That is, the lowermost end of the curved portion of the rigid portion 112 may be disposed on the same plane as the bottom surface of the elastic portion 111. Accordingly, the elastic portion 111 may not be disposed at the lowermost end of the rigid portion 112. Therefore, in the first substrate 110, a pile-up phenomenon in which during the process of pressing or bending the elastic portion 111 which is an elastic material due to the external stress, due to the stress transmitted from the display panel 120 in the lowermost end of the rigid portion 112, a surface of the elastic portion 111 is increased to be higher than the original surface position or the thickness is increased occurs. Therefore, the first substrate 110 may be configured to mitigate or reduce a problem in that the first substrate 110 is deformed or the stress is concentrated.

As described above, the flat portion which is the top surface of the rigid portion 112 is disposed on the same plane as the top surface of the elastic portion 111 and the lowermost end of the rigid portion 112 and the bottom surface of the elastic portion 111 are disposed on the same plane. Accordingly, the thickness of the rigid portion 112 may be equal to the thickness L1 of the first substrate 110. That is, as illustrated in FIG. 5B, a maximum length of the rigid portion 112 in the Z-axis direction may be equal to the length of the first substrate 110 in the Z-axis direction. The rigid portions 112 have a same thickness as the first substrate 110 due to the cavities in which the rigid portions 112 are disposed extends through an entire thickness of the first substrate 110.

In the flexible display device 100 according to the exemplary embodiment of the present disclosure, the thickness of the rigid portion 112 is disposed to be equal to the thickness L1 of the first substrate 110 so that the distortion of the first substrate 110 due to the stress applied in the thickness direction of the display panel 120 may be reduced or minimized.

Specifically, the thickness of the rigid portion 112 in the first substrate 110 may be equal to the thickness L1 of the first substrate 110. That is, in the thickness direction of the first substrate 110, the placement of the elastic portion 111 may be reduced or minimized on the upper portion and the lower portion of the rigid portion 112. Therefore, the phenomenon in which the first substrate 110 is retracted in the thickness direction by the elastic portion 111 which has a lower elasticity than the rigid portion 112 may be reduced or minimized. Accordingly, in the flexible display device 100 according to the exemplary embodiment of the present disclosure, the thickness of the rigid portion 112 is disposed to be equal to the thickness L1 of the first substrate 110 so that the distortion of the first substrate 110 due to the stress applied in the thickness direction of the display panel 120 may be reduced or minimized.

In the meantime, the thickness of one rigid portion 112 may be 100 μm to 1000 μm, 200 μm to 800 μm, or 500 μm to 600 μm. Specifically, the thickness of the first substrate 110 needs to be designed in consideration of a bending characteristic to perform the supporting function of the display panel 120 and be wound or unwound. Therefore, the first substrate 110 needs to have a thickness of 100 μm to 1000 μm so that as illustrated in FIG. a radius of a semicircular shape which is a cross-sectional shape of the rigid portion 112 on a YZ plane, that is, the thickness of the rigid portion 112 is also desirably 100 μm to 1000 μm, 200 μm to 800 μm, or 500 μm to 600 μm. At this time, the cross-sectional shape of the rigid portion 112 on the YZ plane is a semicircular shape so that a radius of the semi-circle, that is, the width L2 of the rigid portion 112 may be 200 μm to 2000 μm, 400 μm to 1600 μm, or 1000 μm to 1200 μm. However, the thickness and the width of the rigid portion 112 are not limited thereto.

A total volume of the plurality of rigid portions 112 may be 80% or less, 60% or less, or 40% or less of a total volume of the first substrate 110. For example, when it is assumed that the total volume of the first substrate 110 is 200×100×

0.5 mm, the thickness of the rigid portion 112 may be 0.5 mm. At this time, theoretically, as illustrated in FIG. at most 200 rigid portions 112 having a semicircular cross section may be inserted into the first substrate 110 and may be 80% of the total volume of the first substrate 110. In this case, the elastic modulus of the first substrate 110 may be 43 Mpa. With regard to this, when it is considered that an elastic modulus of the first substrate 110 of the related art which is formed of a single material, such as stainless steel is generally 50 Mpa, at least 125 rigid portions 112 need to be inserted. Therefore, the distance L3 between the rigid portions 112 is designed to 0.6 mm in one embodiment. The distance L3 may be different in other embodiments.

The plurality of rigid portions 112 may be disposed to be spaced apart from each other in a second direction crossing (e.g., perpendicular to the first direction, that is, the Y-axis direction. The plurality of rigid portions 112 may be disposed to be spaced apart from each other with a predetermined interval. That is, as illustrated in FIG. 5B, the distance L3 between pairs of rigid portions 112 may be the same across the first substrate 110. That is, a distance between each pair of rigid portions 112 from the plurality of rigid portions 112 is a same. Accordingly, when the flexible display device 100 is wound or unwound, the plurality of rigid portions 112 may uniformly disperse a load applied to the display panel 120 on the entire area. But embodiments are not limited thereto. As an example, the distance L3 between the plurality of rigid portions 112 may be various along the Y-axis direction. As an example, the distance L3 between the plurality of rigid portions 112 may be gradually increased or decreased from the center portion to the edge portion along the Y-axis direction, without being limited thereto.

Referring to FIG. 5C, the curved portions of the plurality of rigid portions 112 may be disposed at the outside from a rolling axis of the rollable display device 100. In one embodiment, the rolling axis is along the first direction. Thus, the flexible display device 100 is configured to be rolled about the rolling axis that is along the first direction. Accordingly, the rigid portion 112 may support the load of the display panel 120 on the rear surface of the display panel 120 which is bonded on the rigid portion 112 and may be smoothly wound or unwound together with the display panel 120 through the curved shape of the curved portion.

Hereinafter, a shearing stress according to a position of the flexible display device 100 according to the exemplary embodiment of the present disclosure and a flexible display device of Comparative Embodiment will be described with reference to FIGS. 6A to 6H.

Figure 6A:
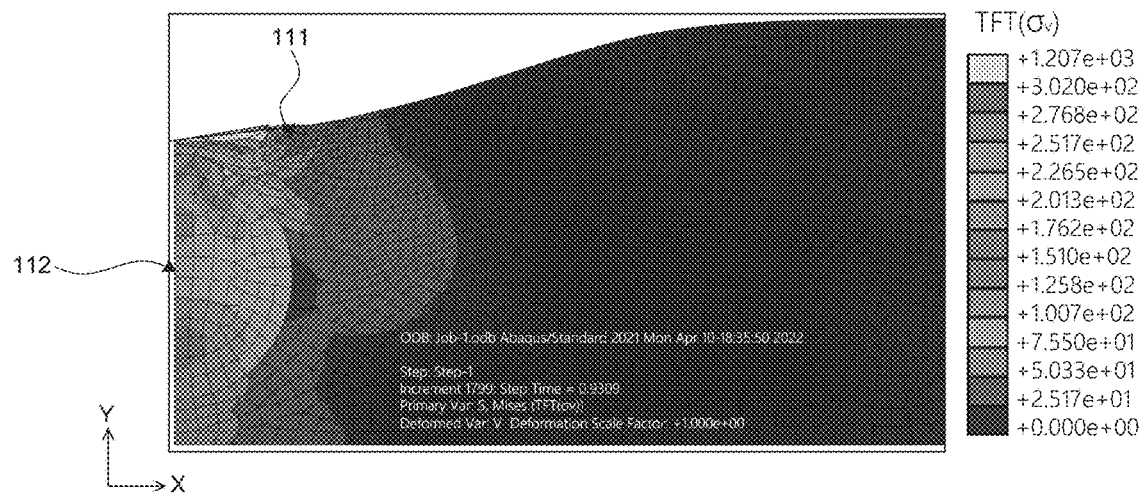
FIG. 6A is a graph illustrating a Von Mises stress and a pile up degree in the vicinity of a rigid portion in a first substrate of a flexible display device according to Comparative Embodiment 1.
Figure 6B:
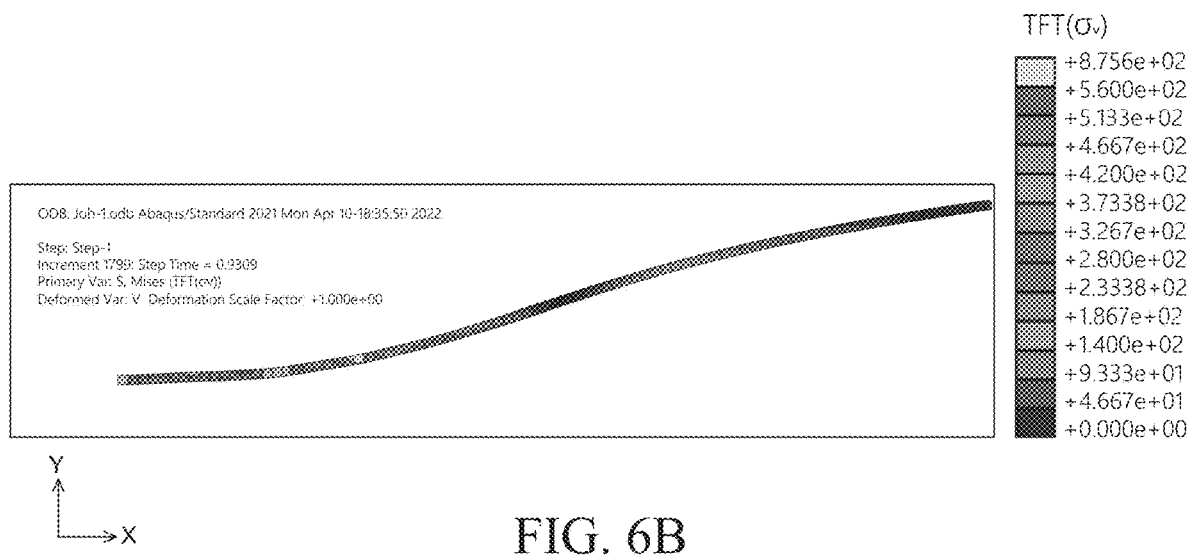
FIG. 6B is a graph illustrating a Von Mises stress value according to a position of a flexible display device according to Comparative Embodiment 1.
Figure 6C:
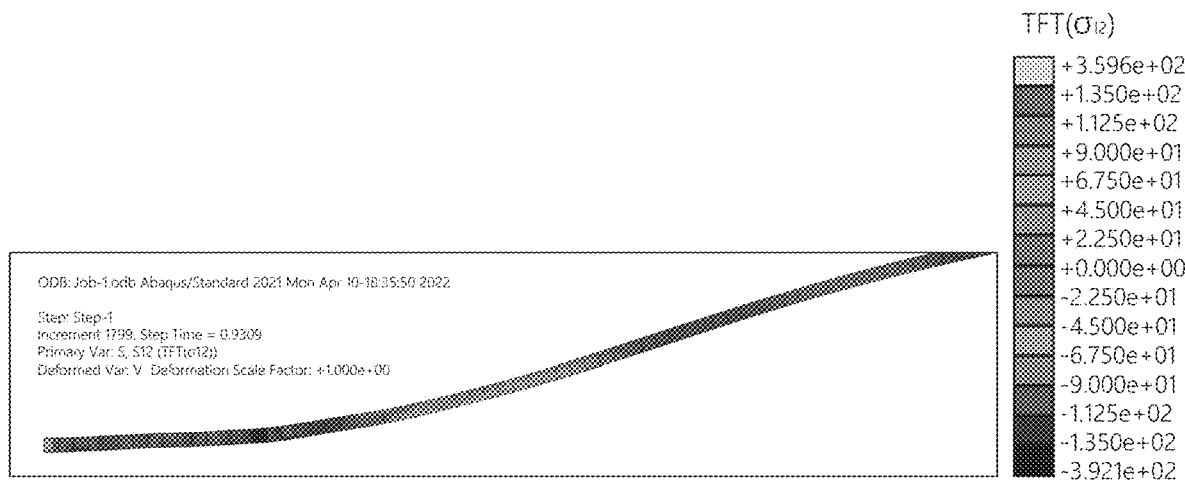
FIG. 6C is a graph illustrating a shearing stress value according to a position of a flexible display device according to Comparative Embodiment 1.
Figure 6D:
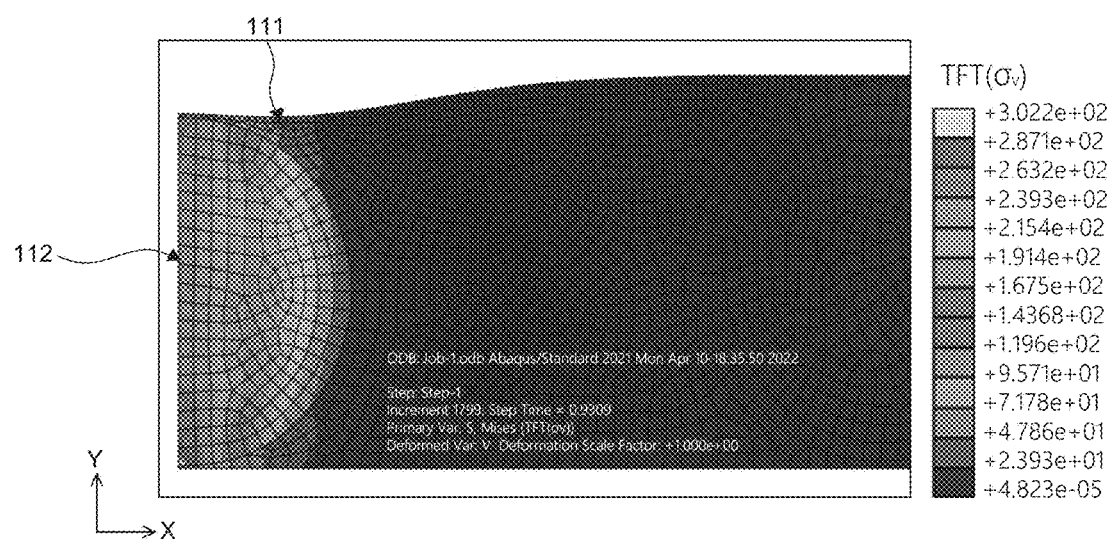
FIG. 6D is a graph illustrating a Von Mises stress and a pile up degree in the vicinity of a rigid portion in a first substrate of a flexible display device according to Comparative Embodiment 2.
Figure 6E:
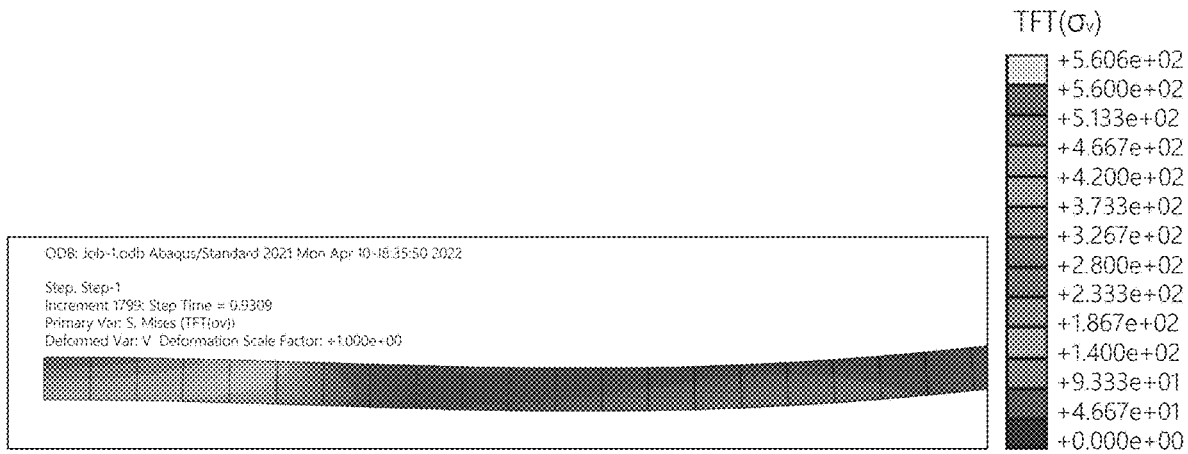
FIG. 6E is a graph illustrating a Von Mises stress value according to a position of a flexible display device according to Comparative Embodiment 2.
Figure 6F:
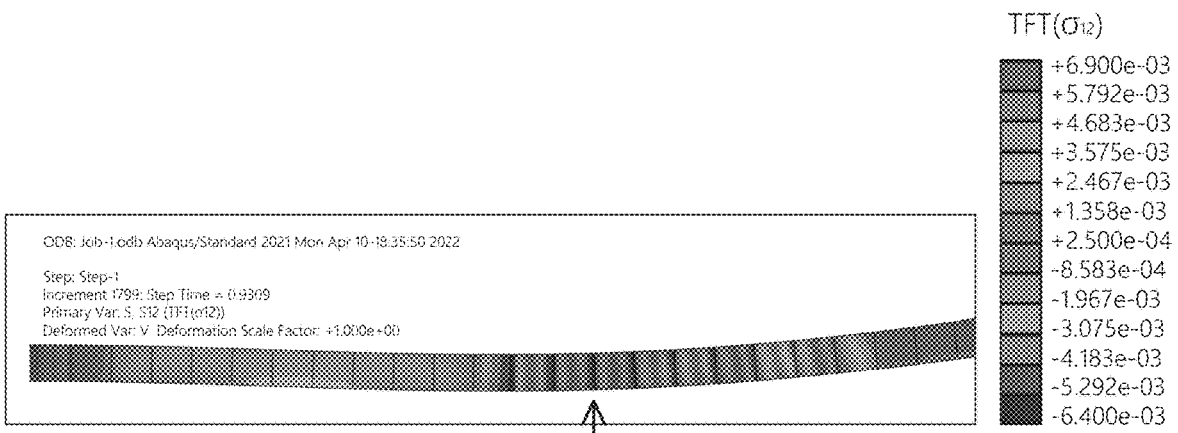
FIG. 6F is a graph illustrating a shearing stress value according to a position of a flexible display device according to Comparative Embodiment 2.
Figure 6G:
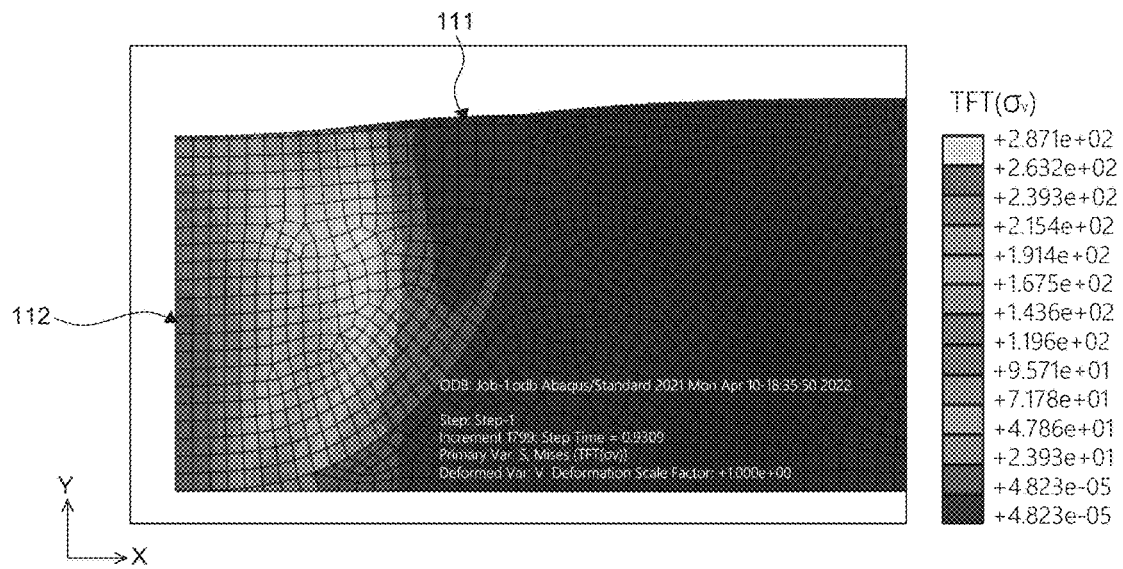
FIG. 6G is a graph illustrating a Von Mises stress and a pile up degree in the vicinity of a rigid portion in a first substrate of a flexible display device according to an exemplary embodiment of the present disclosure.
Figure 6H:
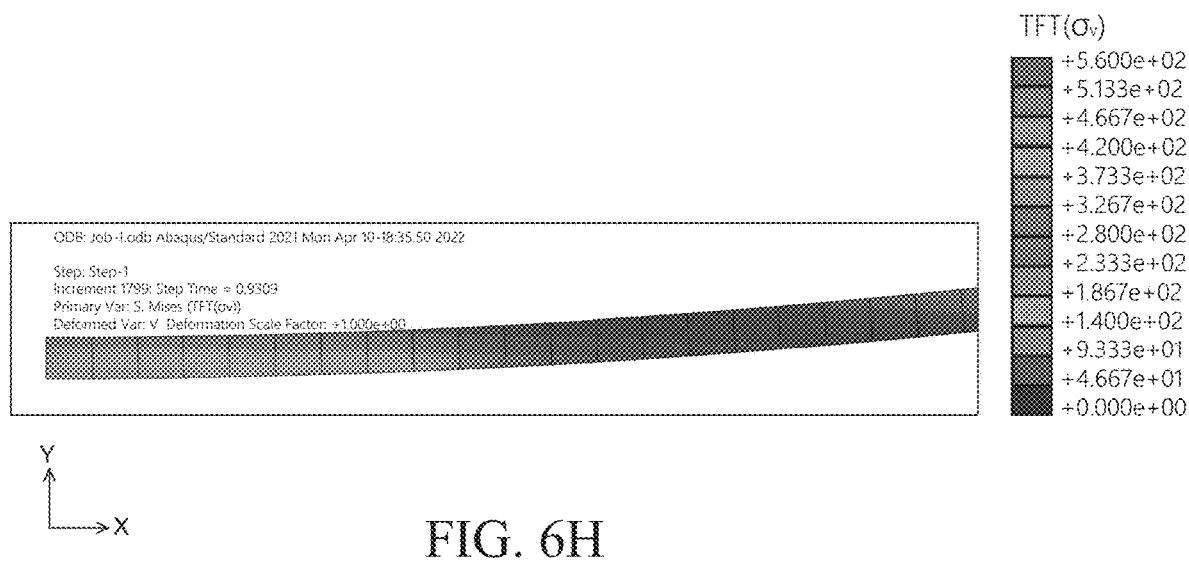
FIG. 6H is a graph illustrating a Von Mises stress value according to a position of a flexible display device according to an exemplary embodiment of the present disclosure.
Figure 6I:
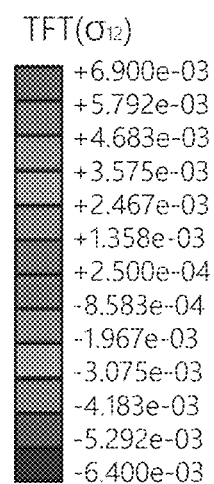
FIG. 6I is a graph illustrating a shearing stress value according to a position of a flexible display device according to an exemplary embodiment of the present disclosure.
Figure 6I:
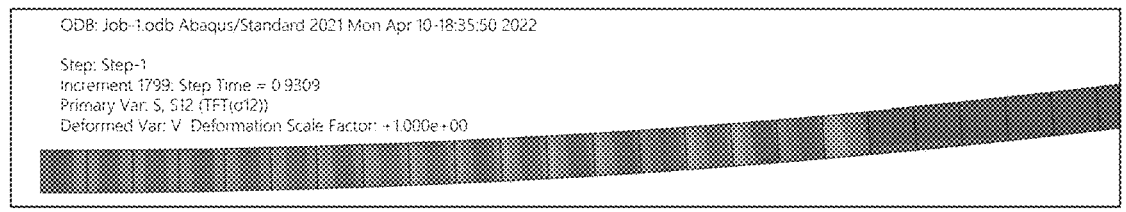
Figure 6I:
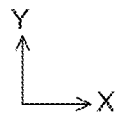

FIG. 6A is a graph illustrating a Von Mises stress and a pile up degree in the vicinity of a rigid portion in a first substrate of a flexible display device according to Comparative Embodiment 1. FIG. 6B is a graph illustrating a Von Mises stress value according to a position of a flexible display device according to Comparative Embodiment 1. FIG. 6C is a graph illustrating a shearing stress value according to a position of a flexible display device according to Comparative Embodiment 1. FIG. 6D is a graph illustrating a Von Mises stress and a pile up degree in the vicinity of a rigid portion in a first substrate of a flexible display device according to Comparative Embodiment 2. FIG. 6E is a graph illustrating a total Von Mises stress value according to a position of a flexible display device according to Comparative Embodiment 2. FIG. 6F is a graph illustrating a shearing stress value according to a position of a flexible display device according to Comparative Embodiment 2. FIG. 6G is a graph illustrating a Von Mises stress and a pile up degree in the vicinity of a rigid portion in a first substrate of a flexible display device according to an exemplary embodiment of the present disclosure. FIG. 6H is a graph illustrating a Mises stress value according to a position of a flexible display device according to an exemplary embodiment of the present disclosure. FIG. 6I is a graph illustrating a shearing stress value according to a position of a flexible display device according to an exemplary embodiment of the present disclosure. At this time, the flexible display device according to Comparative Embodiment 1 is different from the flexible display device 100 according to the exemplary embodiment of the present disclosure in that a cross-sectional shape of the rigid portion is a circle, rather than a semi-circle and a thickness of the elastic portion is larger than a thickness of the rigid portion. At this time, the flexible display device according to Comparative Embodiment 2 is different from the flexible display device 100 according to the exemplary embodiment of the present disclosure in that a cross-sectional shape of the rigid portion is a circle, rather than a semi-circle. FIGS. 6A, 6D, and 6G are graphs of measuring Von Mises stress according to the position in the vicinity of the rigid portion in the first substrate to confirm the Pile up degree in the vicinity of the rigid portion in the first substrate. In FIGS. 6B, 6E, and 6H, $\sigma_v$ is a Von Mises stress value which is applied to the flexible display device. Further, all simulations were analyzed using abaqus and in FIGS. 6A to 6C, the load was 2.7 kgf, in FIGS. 6D to 6F, the load was 3.0 kgf, and in FIGS. 6G to 6I, the load was 5.6 kgf.

First, referring to FIGS. 6A to 6C, in the flexible display device according to Comparative Embodiment 1, it was confirmed that a stress was locally concentrated on the elastic portion from the upper portion of the rigid portion to deform the elastic portion and a maximum Von Mises stress in the first substrate 110 was 1207 Mpa. Further, in the entire flexible display device, the maximum Von Mises stress TFT($\sigma_v$) was 875 Mpa and the maximum shearing stress TFT($\sigma_{12}$) was measured as 392 Mpa.

With regard to this, referring to FIGS. 6D to 6F, it was confirmed from the flexible display device according to Comparative Embodiment 1 that a maximum Von Mises stress in the first substrate 110 was 302 Mpa, in the entire flexible display device, the maximum Von Mises stress TFT($\sigma_v$) was 560 Mpa and the maximum shearing stress TFT($\sigma_{12}$) was reduced to 132 Mpa. Accordingly, as compared with the flexible display device according to Comparative Embodiment 1, it was understood that the flexible display device according to Comparative Embodiment 2 was changed such that the thickness of the rigid portion was equal to the thickness of the elastic portion. Accordingly, in the first substrate, the pile up degree in the vicinity of the rigid portion and the magnitude of the shearing stress were reduced.

Next, referring to FIGS. 6G to 6I, in the flexible display device 100 according to the exemplary embodiment of the present disclosure, it was confirmed that a maximum Von Mises stress in the vicinity of a lower end of the rigid portion 112 was 287 Mpa, in the entire flexible display device, the maximum Von Mises stress TFT($\sigma_v$) was 446 Mpa. It was further confirmed that the maximum shearing stress TFT ($\sigma_{12}$) was reduced to 71 Mpa. Accordingly, in the flexible display device 100 according to the exemplary embodiment of the present disclosure, the simulation was conducted under a load condition which was approximately twice higher than that of Comparative Embodiments 1 and 2. However, it was confirmed that the pile up degree in the vicinity of the rigid portion 112 and the magnitude of the shearing stress were further reduced in the vicinity of the rigid portion 112. That is, it can be understood that the rigid portion 112 having a semi-circular cross-section was more suitable for reducing the pile up phenomenon to the vicinity of the rigid portion 112 and reducing the shearing stress, than the rigid portion 112 having a circular cross-section.

In the meantime, referring to FIGS. 6F and 6I, it was understood that in the flexible display device according to Comparative Embodiment 2 of FIG. 6F, there were portions on which the shearing stress was concentrated due to the influence of the Pile-up generated in the vicinity of the rigid portion 112 of the first substrate 110. In contrast, in the flexible display device 100 according to the exemplary embodiment of the present disclosure of FIG. 6I, it is confirmed that the shearing stress by the pile-up is relatively reduced. Accordingly, in the flexible display device 100 according to the exemplary embodiment of the present disclosure, portions on which the shearing stress is partially concentrated are reduced as compared with the flexible display device according to Comparative Embodiment 2, so that the durability of the flexible display device 100 may be further improved.

In the flexible display device 100 according to the exemplary embodiment of the present disclosure, the first substrate 110 is formed of a composite material including a rigid portion 112 formed of a rigid material and an elastic portion 111 formed of an elastic material. Accordingly, when the flexible display device 100 is wound or unwound, the rolling operation may be performed by the first substrate 110 together with the display panel 120 and the rigidity of the display panel 120 may be reinforced and the load concentrated on the display panel 120 may be effectively dispersed.

Specifically, referring to FIGS. 5A to 5C, the flexible display device 100 according to the exemplary embodiment of the present disclosure may be a composite material including the plurality of rigid portions 112 extending in the first direction and the elastic portion 111 disposed to enclose the plurality of rigid portions 112. Accordingly, the display panel 120 may be buffered by the elastic force of the elastic portion 111 and the rigidity of the display panel 120 may be supplemented by the rigidity of the rigid portion 112 to improve the durability. Therefore, in the flexible display device 100 according to the exemplary embodiment of the present disclosure, the first substrate 110 is formed of a composite material including a rigid portion 112 formed of a rigid material and an elastic portion 111 formed of an elastic material. Accordingly, when the flexible display device 100 is wound or unwound, the rolling operation may be performed by the first substrate 110 together with the display panel 120 and the rigidity of the display panel 120 may be reinforced and the load concentrated on the display panel 120 may be effectively dispersed. Further, the durability of the flexible display device 100 may be further improved.

In the meantime, in the flexible display device 100 according to the exemplary embodiment of the present disclosure, the first substrate 110 is formed of a composite material including a rigid portion 112 formed of a rigid material and an elastic portion 111 formed of an elastic material so that the display quality of the flexible display device 100 may be improved.

In the flexible display device of the related art, an opening pattern, or the like is disposed to assign the flexibility to the first substrate which supports the display panel to enable the flexible driving and also ensure the rigidity to support the display panel. However, the opening pattern is visible from the front surface of the display panel so that there may be a problem in that the display quality of the flexible display device is degraded. In contrast, in the flexible display device 100 according to the exemplary embodiment of the present disclosure, the flexible operation is possible without disposing an opening pattern like the flexible display device of the related art and also the rigidity for supporting the display panel 120 may be ensured. Accordingly, the opening pattern may not be visible from the front surface of the display panel 120. Accordingly, the display quality of the flexible display device 100 may be further improved. Accordingly, in the flexible display device 100 according to the exemplary embodiment of the present disclosure, the first substrate 110 is formed of a composite material including a rigid portion 112 formed of a rigid material and an elastic portion 111 formed of an elastic material so that the display quality of the flexible display device 100 may be further improved.

<Flexible Display Device-Foldable Display Device>

Figure 7:
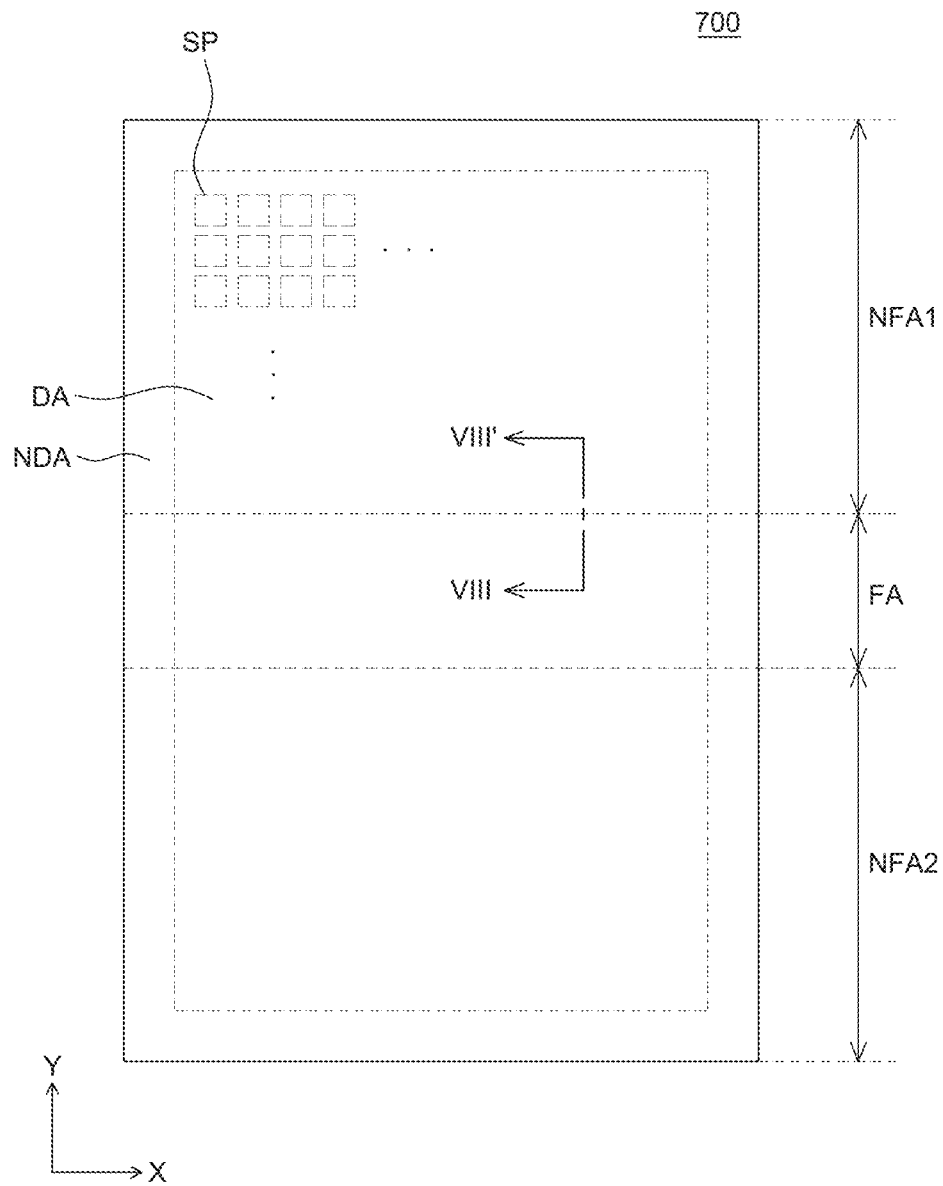
FIG. 7 is a plan view of a flexible display device according to another exemplary embodiment of the present disclosure.
Figure 8A:
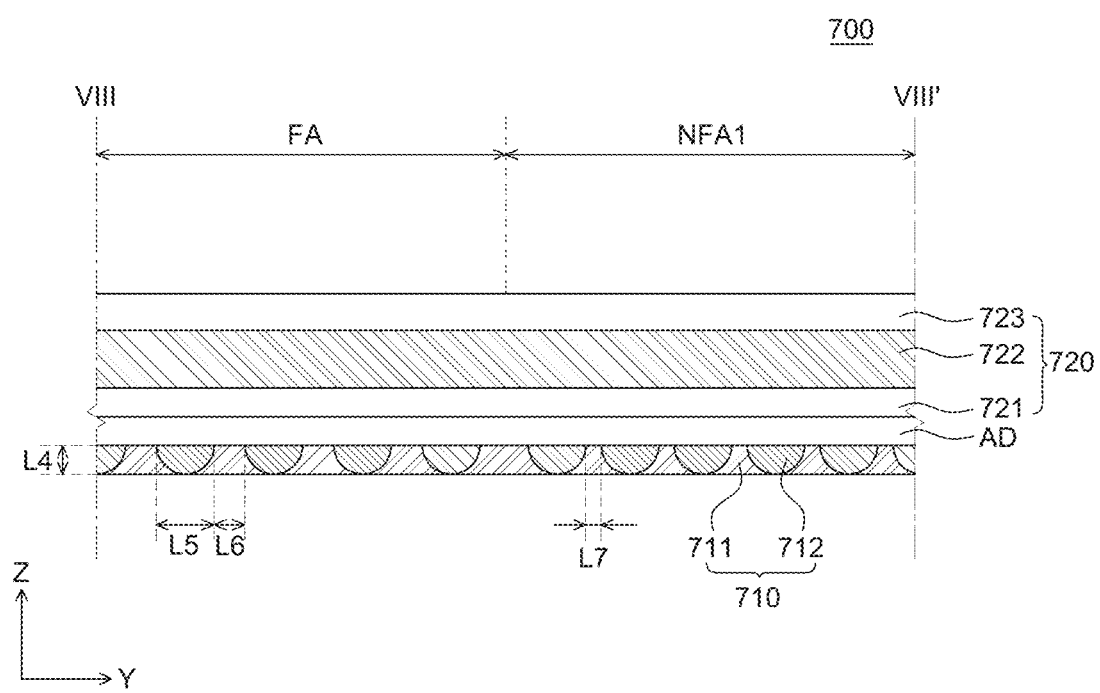
FIG. 8A is a cross-sectional view taken along the line VIII-VIII' of FIG. 7 according to an exemplary embodiment of the present disclosure.
Figure 8B:
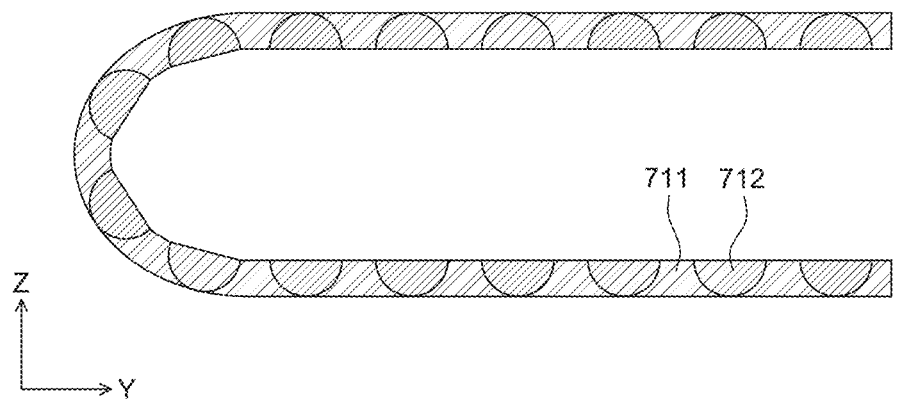
FIG. 8B is a cross-sectional view for explaining a folded state of a first substrate of a flexible display device according to another exemplary embodiment of the present disclosure.

FIG. 7 is a plan view of a flexible display device according to another exemplary embodiment of the present disclosure. FIG. 8A is a cross-sectional view taken along the line VIII-VIII' of FIG. 7 according to an exemplary embodiment of the present disclosure. FIG. 8B is a cross-sectional view for explaining a wound state of a first substrate of a flexible display device according to another exemplary embodiment of the present disclosure.

The flexible display device 700 of FIGS. 7 to 8B is different from the flexible display device 100 of FIGS. 1A to 5C in that a roller unit 160 and a driving unit MP are omitted and a folding area FA (e.g., a first area) and non-folding areas NFA1 and NFA2 (e.g., second areas) are further disposed. However, the other configuration is substantially the same so that a redundant description will be omitted or briefly given.

Referring to FIGS. 7 to 8B, the flexible display device 700 according to another exemplary embodiment of the present disclosure includes a first substrate 710, a display panel 720, and an adhesive unit AD.

The display panel 720 includes a display area DA and a non-display area NDA. Further, the display panel 720 includes a folding area FA and non-folding areas NFA1 and NFA2. The display panel 720 may be divided into the display area DA and the non-display area NDA depending on whether to display images and may be divided into a folding area FA and non-folding areas NFA1 and NFA2 depending on whether to be foldable.

Therefore, a partial area of the display panel 720 may be a display area DA and a folding area FA and the other partial area of the display panel 720 may be a non-display area NDA and the non-folding area NFA. Similarly, a partial area (which may be different from the display area DA) of the display panel 720 may be a folding area FA and the other partial area (which may be different from the non-display area NDA) of the display panel 720 may be the non-folding area NFA. As an example, each of the folding area FA and the non-folding area NFA may be overlapped with both of the display area DA and the non-display area NDA, without being limited thereto.

In the meantime, for the convenience of description, hereinafter, it is assumed that the flexible display device 700 according to another exemplary embodiment of the present disclosure is a foldable display device in which the folding area FA is disposed in only a partial area of the display area DA.

As described above, the display panel 720 may be defined as a folding area FA and non-folding areas NFA1 and NFA2 depending on whether to be foldable. The display panel 720 includes one folding area FA which is foldable and non-folding areas NFA1 and NFA2 excluding the folding area.

The folding area FA is an area which is folded when the flexible display device 700 is folded. As an example, the folding area FA may be folded in accordance with a specific radius of curvature with respect to a folding axis. For example, the folding axis of the folding area FA may be formed in an X-axis direction and the non-folding areas NFA1 and NFA2 may extend from the folding area FA in a Y-axis direction which is perpendicular to the folding axis. When the folding area FA is folded with respect to the folding axis, the folding area FA may form a part of a circle or an oval. At this time, a radius of curvature of the folding area FA may refer to a radius of a circle or an oval formed by the folding area FA.

The non-folding areas NFA1 and NFA2 are areas which are not folded when the flexible display device 700 is folded. That is, the non-folding areas NFA1 and NFA2 maintain their original state (e.g., a flat state or a curved state, etc.) when the flexible display device 700 is folded. The non-folding areas NFA1 and NFA2 may be located on both sides of the folding area FA. That is, the non-folding areas NFA1 and NFA2 may be areas extending to the Y-axis direction with respect to the folding axis. At this time, the folding area FA may be defined between the non-folding areas NFA1 and NFA2. Further, as an example, when the flexible display device 700 is folded with respect to the folding axis, the non-folding areas NFA1 and NFA2 may overlap each other.

As an example, in FIG. 8A, it is illustrated that the flexible display device 700 is a top emission type. It is illustrated that the flexible substrate 721, the pixel unit 722, and the encapsulation layer 723 which are components of the display panel 720 are laminated in a different order from that of the flexible display device 100 of FIGS. 1A to 5C. However, a light emitting manner of the flexible display device 700 and a laminating order of components are not limited thereto.

Referring to FIGS. 7 to 8B, in the flexible display device 700 according to another exemplary embodiment of the present disclosure, a first substrate 710 may include a rigid portion 712 and an elastic portion 711.

The rigid portion 712 may be formed of a material including an improved flexibility compared with those for rigid portions 112, such as metal or an alloy, such as stainless steel, etc. The flexible display device 700 according to another exemplary embodiment of the present disclosure may be lighter and have smaller bending radius R value than the rollable display device so that the flexibility may be further required for the material of the first substrate 710. Therefore, the rigid portion 712 may be formed of a material including an improved flexibility compared with those for rigid portions 112, such as metal or an alloy, such as stainless steel. At this time, an elastic modulus of the rigid portion 712 may be 13 Gpa to 400 Gpa.

The plurality of rigid portions 712 may be disposed to be spaced apart to each other in the second direction, that is, in a Y-axis direction. For example, when the diameter of the rigid portion 712, that is, a width L5 of the rigid portion 712 is 1 mm, in consideration of the durability when a touch pen (a diameter of 2 mm) is used for the foldable display device, the interval between the plurality of rigid portions 712 is desirably 0.6 mm or smaller. Further, in order to reduce or minimize the collision between the rigid portions 712, the interval is desirably 0.05 mm or larger. In summary, the distance between the plurality of rigid portions 712 may be 0.05 mm to 0.6 mm That is, the distance between the plurality of rigid portions 712 may be 5% to 60% of the length of the flat portion of one rigid portion 712 in the second direction. In the meantime, as described above, the thickness of the plurality of rigid portions 712 may be equal to the thickness L4 of the first substrate 710. The thickness of the plurality of rigid portions 712 may be 100 µm to 500 µm, in consideration of a size of small and medium products, such as a foldable display device. However, the thickness of the rigid portion 712 and the interval between the plurality of rigid portions 712 are not limited thereto.

Referring to FIG. 8A, as an example, an interval L6 between the plurality of rigid portions 712 in the folding area may be greater than an interval L7 between the plurality of rigid portions 712 in the non-folding areas NFA1 and NFA2. When the plurality of rigid portions 712 are disposed to be close to each other, the rigidity of the first substrate 710 is improved, but the flexibility is degraded. In the meantime, when the plurality of rigid portions 712 are disposed to be far from each other, the rigidity of the first substrate 710 is slightly degraded, but the flexibility may be improved. Therefore, in the flexible display device 700 according to another exemplary embodiment of the present disclosure, the interval L6 between the plurality of rigid portions 712 in the folding area FA in which the flexibility is relatively more required is set to be greater than the interval L7 between the plurality of rigid portions 712 in the non-folding areas NFA1 and NFA2 in which the rigidity is relatively more required. Therefore, the physical properties required for each of the folding area FA and the non-folding areas NFA1 and NFA2 may be satisfied, respectively.

In the meantime, in order to satisfy the physical properties required for each of the folding area FA and the non-folding areas NFA1 and NFA2, the sizes of the plurality of rigid portions 712 in the folding area FA may be designed to be larger than the sizes of the plurality of rigid portions 712 in the non-folding areas NFA1 and NFA2, respectively, but are not limited thereto.

In the flexible display device 700 according to another exemplary embodiment of the present disclosure, the first substrate 710 is formed of a composite material including a rigid portion 712 formed of a rigid material and an elastic portion 711 formed of an elastic material. Accordingly, when the flexible display device 700 is wound or unwound, the first substrate 710 may be foldably driven together with the display panel 720 and the rigidity of the display panel 720 may be reinforced and the load concentrated on the display panel 720 may be effectively dispersed.

Specifically, referring to FIGS. 7 to 8B, the flexible display device 700 according to another exemplary embodiment of the present disclosure may be a composite material including the plurality of rigid portions 712 extending in the first direction and the elastic portion 711 disposed to enclose the plurality of rigid portions 712. Accordingly, the display panel 720 may be buffered by the elastic force of the elastic portion 711 and the rigidity of the display panel 720 may be supplemented by the rigidity of the rigid portion 712 to improve the durability. In the flexible display device 700 according to another exemplary embodiment of the present disclosure, the first substrate 710 is formed of a composite material including a rigid portion 712 formed of a rigid material and an elastic portion 711 formed of an elastic material. Accordingly, when the flexible display device 700 is wound or unwound, the first substrate 710 may be foldably driven together with the display panel 720 and the rigidity of the display panel 720 may be reinforced and the load concentrated on the display panel 720 may be effectively dispersed. Further, the durability of the flexible display device 700 may be further improved.

In the meantime, in the flexible display device 700 according to another exemplary embodiment of the present disclosure, the first substrate 710 is formed of a composite material including a rigid portion 712 formed of a rigid material and an elastic portion 711 formed of an elastic material. Therefore, the physical properties requested for the folding area FA and the non-folding areas NFA1 and NFA2, respectively, are satisfied and the recognition of the boundary of the folding area FA and the non-folding area NFA1 and NFA2 from the front surface of the display panel 720 may be reduced or minimized.

Specifically, in the flexible display device of the related art, the first substrate of the single material is disposed to have different opening patterns in the folding area and the non-folding area. Accordingly, in the flexible display device of the related art, there may be a problem in that the boundary of the folding area and the non-folding area is recognized from the front surface of the display panel. In the meantime, in the flexible display device 700 according to another exemplary embodiment of the present disclosure, the first substrate 710 is disposed such that the interval L6 between the plurality of rigid portions 712 in the folding area FA is larger than the interval L7 between the plurality of rigid portions in the non-folding areas NFA1 and NFA2. Therefore, the physical properties required for the folding area FA and the non-folding areas NFA1 and NFA2 may be satisfied, respectively, without disposing different opening patterns in the folding area FA and the non-folding areas NFA1 and NFA2, respectively. Accordingly, in the flexible display device 700 according to another exemplary embodiment of the present disclosure, the first substrate 710 is formed of a composite material including a rigid portion 712 formed of a rigid material and an elastic portion 711 formed of an elastic material. Therefore, the physical properties requested for the folding area FA and the non-folding areas NFA1 and NFA2 are satisfied, respectively, and the recognition of the boundary of the folding area FA and the non-folding area NFA1 and NFA2 from the front surface of the display panel 720 may be reduced or minimized. Further, the display quality of the flexible display device 700 may be improved.

In the meantime, in FIGS. 7 to 8B, it is illustrated that the flexible display device 700 is a foldable display device having one folding area FA. However, the flexible display device 700 according to another exemplary embodiment of the present disclosure may be a multi-folding display device having at least two folding areas and at least three non-folding areas, but is not limited thereto.

<Flexible Display Device-Slidable Display Device>

Figure 9A:
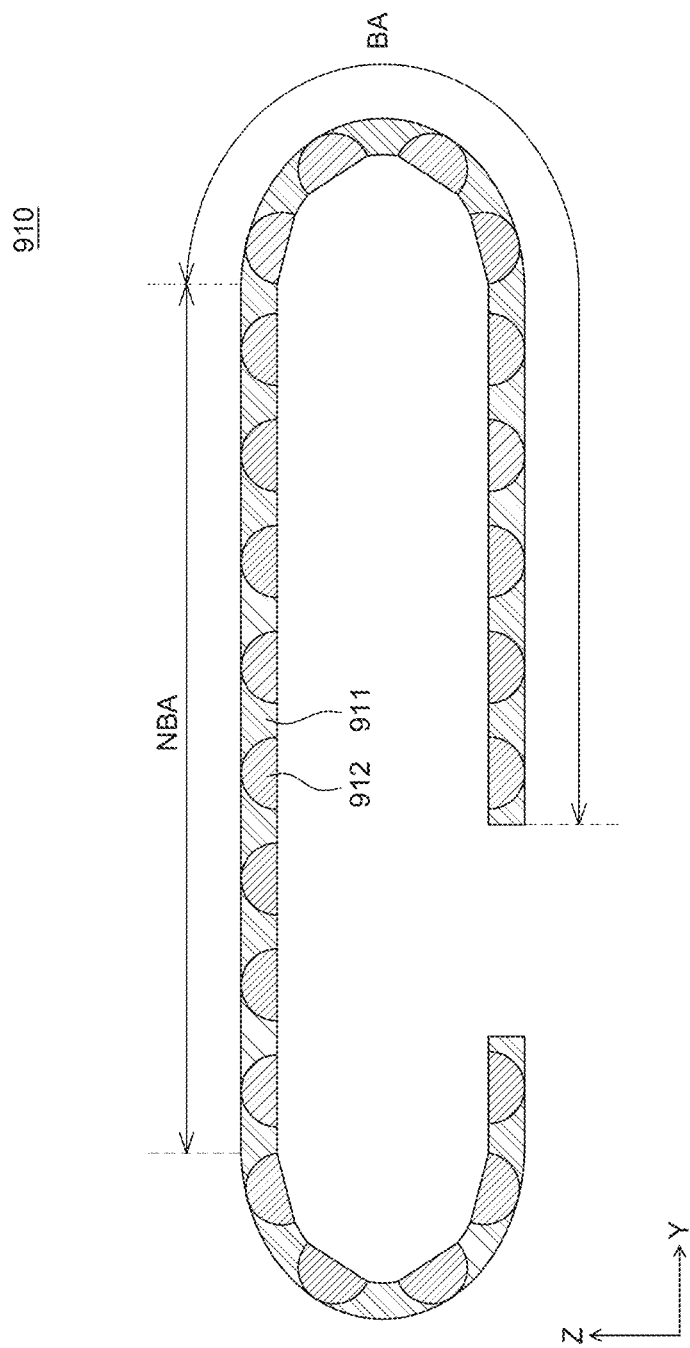
FIGS. 9A and 9B are cross-sectional views for explaining sliding of a first substrate of a flexible display device according to still another exemplary embodiment of the present disclosure.
Figure 9B:
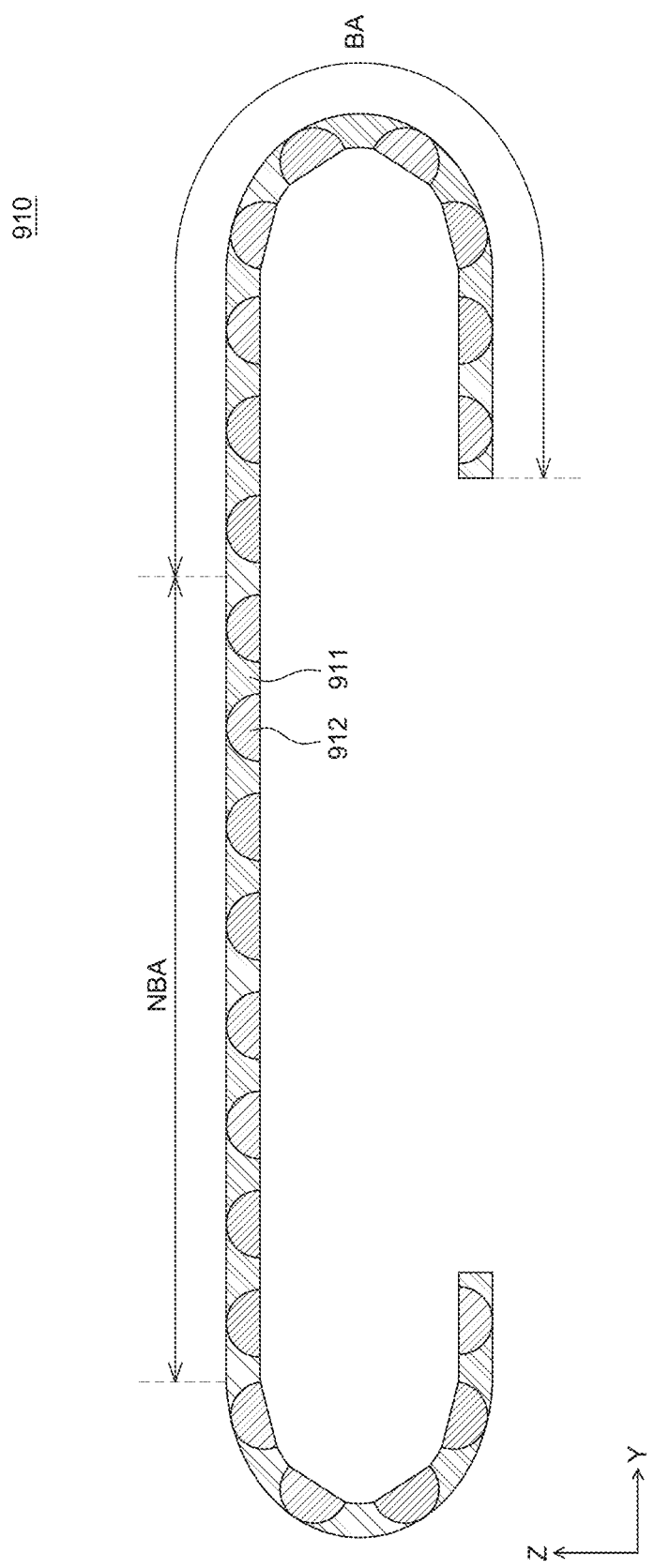

FIGS. 9A and 9B are cross-sectional views for explaining sliding of a first substrate of a flexible display device according to still another exemplary embodiment of the present disclosure.

A first substrate 910 of a flexible display device of FIGS. 9A and 9B is different from the first substrate 710 of the flexible display device 700 of FIGS. 7 to 8B in that a bending area BA and a non-bending area NBA are included, instead of the folding area FA and the non-folding areas NFA1 and NFA2. However, the other configuration is substantially the same so that a redundant description will be omitted or briefly given.

The flexible display device according to still another exemplary embodiment of the present disclosure may be a slidable display device which is slidably driven to slide out and insert a display unit DP.

A display unit DP of the display device according to still another exemplary embodiment of the present disclosure may be configured by the non-bending area NBA and a bending area BA which is connected to the non-bending area NBA to be bent. Therefore, the first substrate 910 of the display unit DP may also include a bending area BA and the non-bending area NBA.

The bending area BA is configured to be bendable. Therefore, the bending area BA may be slid out or inserted into the inside of the flexible display device through the sliding operation.

The non-bending area NBA is configured to maintain its original state (e.g., a flat state or a curved state, etc.). Accordingly, the non-bending area NBA may support the bending area BA during the sliding operation of the bending area BA by fixing one side of the bending area BA connected to the non-bending area NBA.

Referring to FIGS. 9A and 9B, in the flexible display device according to still another exemplary embodiment of the present disclosure, the bending area BA is configured to be slidably driven. As an example, the bending area BA may be configured to be slidably driven while maintaining a constant curvature. Therefore, depending on the user's need, the display unit DP may be expanded or accommodated while maintaining the thickness of the flexible display device. As an example, at least a portion of the bending area BA adjacent to the non-bending area NBA is capable of being unfolded while the remaining portion of the bending area BA maintains a constant curvature. As an example, the portion of the bending area BA is adjustable in a range between 0 to the overall length of the bending area BA.

Specifically, in the accommodated state of the display unit DP, the bending area BA of the first substrate 910 of the display unit DP may be disposed in a bent state with a constant curvature as illustrated in FIG. 9A. Further, in a state in which the display unit DP is drawn out through sliding driving, the bending area BA of the first substrate 910 of the display unit DP may be unfolded in a flat shape while maintaining the same curvature as in the accommodated state. Accordingly, in the flexible display device according to still another exemplary embodiment of the present disclosure, the bending area BA is configured to be slidably driven while maintaining a constant curvature. Therefore, depending on the user's need, the display unit DP may be expanded or accommodated while maintaining the thickness of the flexible display device.

In the meantime, the first substrate 910 of the flexible display device according to still another exemplary embodiment of the present disclosure is configured by an elastic portion 911 and a rigid portion 912 and is flexibly driven in all areas so that the first substrate may be applied to various types of flexible display devices. That is, the first substrate 910 of the flexible display device according to still another exemplary embodiment of the present disclosure may be applied to various flexible display devices which requires flexibility so that a degree of freedom of design of the flexible display device may be improved. But embodiments are not limited thereto. As an example, the first substrate 910 may be disposed only in the bending area BA, while a rigid substrate could be disposed in the non-bending area NBA.

Figure 10:
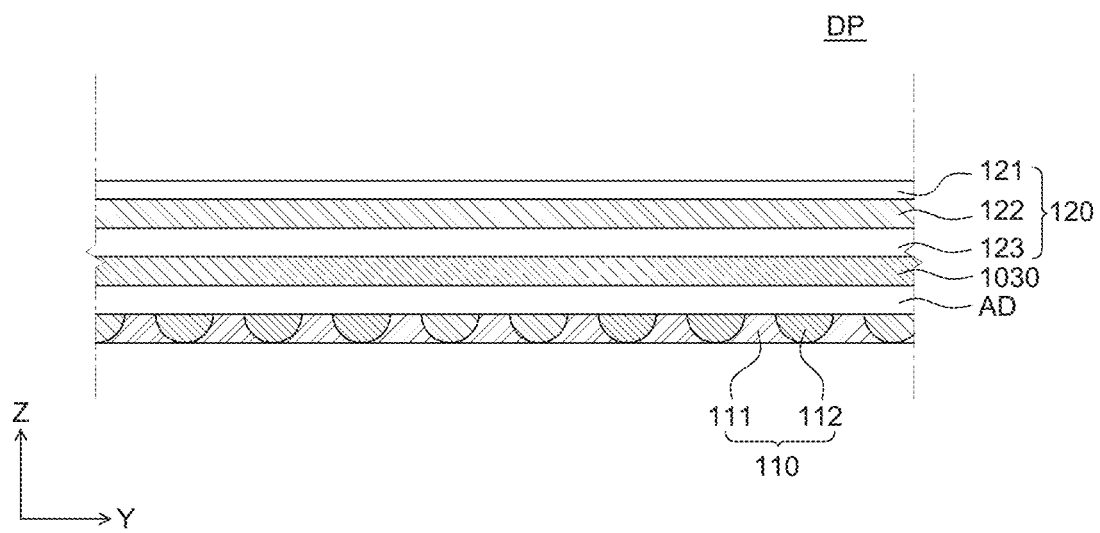
FIG. 10 is a schematic cross-sectional view of a display unit of a flexible display device according to still another exemplary embodiment of the present disclosure.
Figure 11:
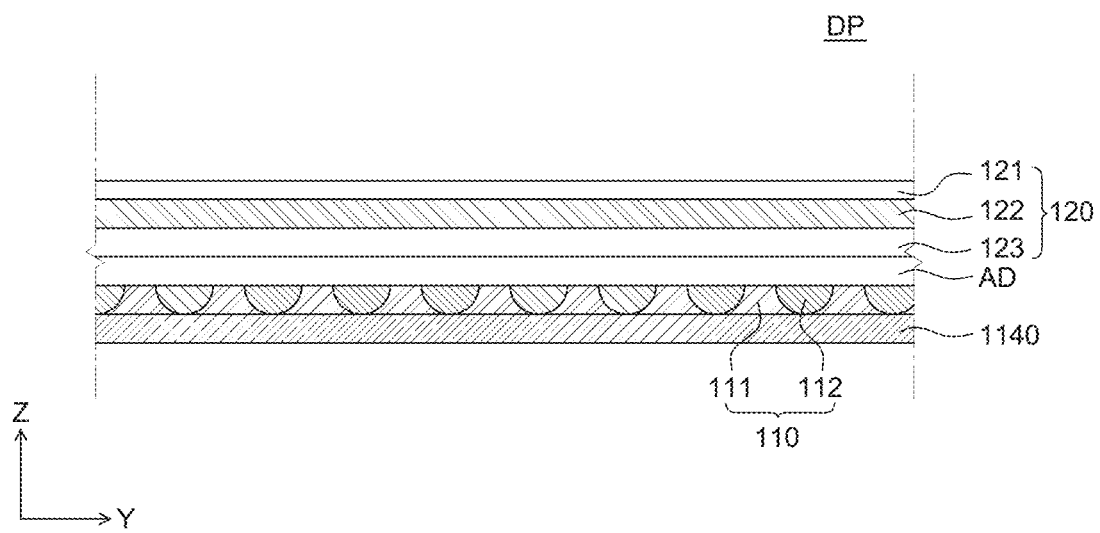
FIG. 11 is a schematic cross-sectional view of a display unit of a flexible display device according to still another exemplary embodiment of the present disclosure.

FIG. 10 is a schematic cross-sectional view of a display unit of a flexible display device according to still another exemplary embodiment of the present disclosure. FIG. 11 is a schematic cross-sectional view of a display unit of a flexible display device according to still another exemplary embodiment of the present disclosure.

The flexible display device of FIGS. 10 and 11 are different from the flexible display device 100 of FIGS. 1A to 5C in that the flexible display device further include a second substrate 1030 or a third substrate 1140. However, the other configuration is substantially the same so that a redundant description will be omitted or briefly given.

Referring to FIGS. 10 and 11, the flexible display device according to still another exemplary embodiment of the present disclosure may further include any one of a second substrate 1030 disposed between the first substrate 110 and the display panel 120 or a third substrate 1140 disposed below the first substrate 110.

At this time, the second substrate 1030 and the third substrate 1140 may be formed of a material having a rigidity and a flexibility. Therefore, when the flexible display device is flexibly driven, the second substrate 1030 and the third substrate 1140 may maintain the curvature of the display panel to be further constant and further suppress the crease generated on a top surface of the display panel. For example, the second substrate 1030 and the third substrate 1140 may be formed of polyimide (PI) or stainless steel, etc. As an example, the second substrate 1030 and the third substrate 1140 may have a rigidity greater than the elastic portion 111 and smaller than the rigid portion 112, without being limited thereto.

The second substrate 1030 and the third substrate 1140 may be included to support the display panel 120 together with the first substrate 110, between the display panel 120 and the first substrate 110 or below the first substrate 110 and may be referred to as top plates.

The exemplary embodiments of the present disclosure can also be described as follows:

According to an aspect of the present disclosure, a flexible display device includes a display panel which displays an image; and a first substrate which is disposed below the display panel to support the display panel and includes a plurality of rigid portions extending in a first direction and an elastic portion disposed to enclose the plurality of rigid portions, each of the plurality of rigid portions includes a flat portion located in a direction in which the display panel is disposed and a curved portion connected to the flat portion and protruding in an opposite direction of the flat portion.

The plurality of rigid portions may be disposed to be spaced apart from each other in a second direction perpendicular to the first direction.

A total volume of the plurality of rigid portions may be 80% or lower of a total volume of the first substrate.

The flat portion of the rigid portion may be disposed on the same plane as a top surface of the elastic portion so as to be exposed toward the display panel.

A lowermost end of the curved portion of the rigid portion may be disposed on the same plane as a bottom surface of the elastic portion.

The rigid portion may have a semi-cylindrical shape extending in the first direction.

The flexible display device may further comprise any one of a second substrate disposed between the first substrate and the display panel and a third substrate disposed below the first substrate.

The second substrate and the third substrate may be formed of polyimide (PI) or stainless steel.

The rigid portion may be formed of a high elastic and high rigid material, which is any one of polymer, such as veroblack, a composite material, metal, an alloy, an oxide ceramic, a nitride ceramic, and a carbide ceramic.

An elastic modulus of the elastic portion may be 10 Mpa to 1400 Mpa.

The elastic portion may be formed of an elastomer-based material, such as silicon and rubber.

The flexible display device may be a foldable display device.

The first substrate may further include a folding area which has a folding axis formed in the first direction and is foldable, and a non-folding area which is an area excluding the folding area.

The plurality of rigid portions may be disposed to be spaced apart from each other in a second direction perpendicular to the first direction.

An interval between the plurality of rigid portions or a size of each of the plurality of rigid portions in the folding area is larger than an interval between the plurality of rigid portions or a size of each of the plurality of rigid portions in the non-folding area.

The plurality of rigid portions may be disposed to be spaced apart from each other in a second direction perpendicular to the first direction.

A distance between the plurality of rigid portions may be 5% to 60% of a length of a flat portion of one rigid portion in the second direction.

The distance between the plurality of rigid portions may be 0.05 mm to 0.6 mm.

An elastic modulus of the rigid portion may be 13 Gpa to 400 Gpa.

The rigid portion may be formed of metal or an alloy, such as stainless steel.

A maximum length of one rigid portion in a thickness direction may be 100 μm to 500 μm.

The flexible display device may further comprise a rolling axis formed in the first direction.

The plurality of rigid portions may be disposed to be spaced apart from each other with a constant interval along a second direction perpendicular to the first direction.

The rigid portion may be formed of any one of oxide ceramic, nitride ceramic, carbide ceramic.

An elastic modulus of the rigid portion may be 60 Gpa to 1000 Gpa.

A maximum length of one rigid portion in a thickness direction may be 100 μm to 1000 μm.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display device, comprising:
a display panel configured to display an image; and
a first substrate on the display panel and supporting the display panel, the first substrate including a plurality of first portions extending in a first direction and a second portion between the plurality of first portions that is more elastic than the plurality of first portions,
wherein each of the plurality of first portions includes a flat portion that faces the display panel and a curved portion connected to the flat portion and protruding in a direction away from the flat portion such that the curved portion of at least one of the plurality of first portions contacts a bottom surface of the first substrate.

2. The flexible display device according to claim 1, wherein the plurality of first portions are spaced apart from each other in a second direction that is perpendicular to the first direction.

3. The flexible display device according to claim 1, wherein a total volume of the plurality of first portions is at most 80% of a total volume of the first substrate.

4. The flexible display device according to claim 1, wherein the flat portion of at least one of the plurality of first portions is on a same plane as a upper surface of the elastic portion and is exposed toward the display panel.

5. The flexible display device according to claim 4, wherein a lowermost end of the curved portion of at least one of the plurality of first portions is on a same plane as a bottom surface of the elastic portion that is opposite the upper surface of the second portion.

6. The flexible display device according to claim 1, wherein each of the plurality of first portions has a semi-cylindrical shape extending in the first direction.

7. The flexible display device according to claim 1, further comprising:
   any one of a second substrate between the first substrate and the display panel; and
   a third substrate below the first substrate.

8. The flexible display device according to claim 1, wherein an elastic modulus of the second portion is in a range of 10 MPa to 1400 MPa.

9. The flexible display device according to claim 1, wherein the flexible display device is a foldable display device, and the first substrate further comprises:
   a folding area having a folding axis along the first direction, the folding area configured to be folded; and
   a non-folding area that excludes the folding area.

10. The flexible display device according to claim 9, wherein the plurality of first portions are spaced apart from each other in a second direction perpendicular to the first direction, and
   wherein an interval between first portions from the plurality of first portions in the folding area is larger than an interval between first portions from the plurality of first portions in the non-folding area, or a size of each of the first portions in the folding area is larger than a size of each of the first portions in the non-folding area.

11. The flexible display device according to claim 9, wherein the plurality of first portions are spaced apart from each other in a second direction perpendicular to the first direction, and an interval between the plurality of first portions is in a range of 5% to 60% of a length of a flat portion of one first portion from the plurality of first portions in the second direction.

12. The flexible display device according to claim 11, wherein the interval between the plurality of first portions is in a range of 0.05 mm to 0.6 mm.

13. The flexible display device according to claim 9, wherein an elastic modulus of the plurality of first portions is 13 GPa to 400 GPa.

14. The flexible display device according to claim 9, wherein a thickness of a first portion from the plurality of first portions is in a range of 100 μm to 500 μm.

15. The flexible display device according to claim 1, wherein the flexible display device is configured to be rolled about a rolling axis that is along the first direction.

16. The flexible display device according to claim 15, wherein a distance between each pair of first portions from the plurality of first portions is a same along a second direction that is perpendicular to the first direction.

17. The flexible display device according to claim 15, wherein an elastic modulus of the plurality of first portions is in a range of 60 GPa to 1000 GPa.

18. The flexible display device according to claim 15, wherein a thickness of a first portion from the plurality of first portions is in a range of 100 μm to 1000 μm.

19. The flexible display device according to claim 1, further comprising:
   an adhesive unit between the display panel and the first substrate, the adhesive unit bonding together the display panel and the first substrate.

20. The flexible display device according to claim 1, wherein the first portion has a higher elastic modulus and a lower coefficient of thermal expansion compared with those of the second portion.

* * * * *